US007984354B2

(12) United States Patent
Goswami et al.

(10) Patent No.: US 7,984,354 B2
(45) Date of Patent: *Jul. 19, 2011

(54) GENERATING RESPONSES TO PATTERNS STIMULATING AN ELECTRONIC CIRCUIT WITH TIMING EXCEPTION PATHS

(75) Inventors: Dhiraj Goswami, Wilsonville, OR (US); Kun-Han Tsai, Lake Oswego, OR (US); Mark Kassab, Wilsonville, OR (US); Janusz Rajski, West Linn, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/494,121

(22) Filed: Jun. 29, 2009

(65) Prior Publication Data

US 2009/0327986 A1 Dec. 31, 2009

Related U.S. Application Data

(63) Continuation of application No. 11/478,120, filed on Jun. 28, 2006, now Pat. No. 7,555,689.

(60) Provisional application No. 60/694,884, filed on Jun. 28, 2005.

(51) Int. Cl.
*G01R 31/28* (2006.01)
(52) U.S. Cl. .......... 714/741; 714/32; 714/724; 714/726; 714/727; 714/729; 703/3; 703/4; 703/13; 703/14; 703/19; 703/21; 703/22; 703/23
(58) Field of Classification Search ........................ None
See application file for complete search history.

(56) References Cited

U.S. PATENT DOCUMENTS

| 5,452,239 | A | * | 9/1995 | Dai et al. | 703/19 |
| 5,477,474 | A | | 12/1995 | Southgate et al. | |
| 6,385,750 | B1 | * | 5/2002 | Kapur et al. | 714/738 |
| 6,546,507 | B1 | * | 4/2003 | Coyle et al. | 714/43 |
| 7,039,845 | B2 | * | 5/2006 | Rearick et al. | 714/738 |
| 7,228,262 | B2 | | 6/2007 | Anzou et al. | |
| 2004/0205681 | A1 | | 10/2004 | Nozuyama | |
| 2005/0149790 | A1 | | 7/2005 | Yoshida et al. | |
| 2005/0235184 | A1 | * | 10/2005 | Yamauchi | 714/726 |
| 2006/0190781 | A1 | | 8/2006 | Farmer et al. | |

OTHER PUBLICATIONS

Tendolkar et al., "Novel Techniques for Achieving At-Speed Transition Fault Test Coverage for Motorola's Microprocessors Based on Power-PC Instruction Se Architecture"., IEEE, 2002.*

(Continued)

*Primary Examiner* — John P Trimmings
(74) *Attorney, Agent, or Firm* — Klarquist Sparkman, LLP

(57) ABSTRACT

Improved responses can be generated to scan patterns (e.g., test patterns) for an electronic circuit designs having timing exception paths by more accurately determining the unknown values that propagate to observation points in the circuit, where the response is captured. For instance, the responses are determined more accurately by analyzing the effect of sensitizing a timing exception path during each time frame associated with a scan pattern. Path sensitization can be determined based on observing whether values injected at starting points of the timing exception paths due to signal transitions and glitches propagate to their end points. The response can be updated by masking the affected end points and propagating unknown values further in the circuit to determine whether they are captured at observation points of the circuit. For instance, the methods and systems described herein may result in reduced unknowns, improved test coverage and test compression.

21 Claims, 16 Drawing Sheets

OTHER PUBLICATIONS

Tendolkar et al., "Novel techniques for achieving high at-speed transition fault test coverage for Motorola's microprocessors based on PowerPC instruction set architecture," *Proc. IEEE VLSI Test Symp.*, pp. 3-8 (2002).

Beck et al., "Measures to Improve Delay Fault Testing on Low-Cost Testers—A Case Study," *Proc. IEEE VLSI Test Symp.*, pp. 223-228 (May 2005).

Benware et al., "Effectiveness Comparisons of Outlier Screening Methods for Frequency Dependent Defects on Complex ASICs," *Proc. IEEE VLSI Test Symp.*, pp. 39-46 (2003).

Chickermane et al., "Channel Masking Synthesis for Efficient On-Chip Test Compression," *Proc. ITC*, pp. 452-461 (2004).

Cory et al., "Speed Binning with Path Delay Test in 150-nm Technology," *IEEE Design & Test of Computers*, pp. 41-45 (Sep.-Oct. 2003).

Goswami et al., "At-Speed Testing with Timing Exceptions and Constraints—Case Studies," 7 pp. (also published as Goswami et al., "At-Speed Testing with Timing Exceptions and Constraints—Case Studies," *Asian Test Symp.*, pp. 153-162 (2006)).

Goswami et al., "Test Generation in the Presence of Timing Exceptions and Constraints," *DAC*, pp. 688-693 (Jun. 2007).

Higuchi et al., "Enhancing the Performance of Multi-Cycle Path Analysis in an Industrial Setting," *Proc. Asia and South Pacific-DAC*, pp. 192-197 (2004).

Kim et al., "Delay Defect Characteristics and Testing Strategies," *IEEE Design & Test of Computers*, pp. 8-16 (Sep.-Oct. 2003).

Lin et al., "High-frequency, At-speed Scan Testing," *IEEE Design & Test of Computers*, pp. 17-25 (Sep.-Oct. 2003).

Mitra et al., "X-compact: an efficient response compaction technique," *IEEE Trans. on CAD*, vol. 23, Issue 3, pp. 421-432 (2004).

Needham et al., "High Volume Microprocessor Test Escapes, an Analysis of Defects our Tests are Missing," 10 pp. (also published as Needham et al., "High Volume Microprocessor Test Escapes, an Analysis of Defects our Tests are Missing," *Proc. ITC*, pp. 25-34 (1998)).

Nordstrom, "Formal Verification—A Viable alternative to Simulation?" *Proc. Verilog HDL Conference*, pp. 90-95 (1996).

Rajski et al., "Embedded Deterministic Test for Low-Cost Manufacturing Test," *Proc. ITC*, pp. 301-310 (2002).

Saxena et al., "Scan-Based Transition Fault Testing—Implementation and Low Cost Test Challenges," *Proc. International Test Conference*, pp. 1120-1129 (2002).

Sitchinava et al., "Changing the Scan Enable During Shift," 6 pp. (also published as Sitchinava et al., "Changing the Scan Enable During Shift," *Proc. IEEE VLSI Test Symp.*, pp. 73-78 (2004)).

Swanson et al., "Using Timing Constraints for Generating At-Speed Test Patterns," *Evaluation Engineering*, 8 pp. (Oct. 2006).

Vorisek et al., "Improved Handling of False and Multicycle Paths in ATPG," *Proc. IEEE VLSI Test Symp.*, 6 pp. (2006) (also published as Vorisek et al., "Improved Handling of False and Multicycle Paths in ATPG," *Proc. IEEE VLSI Test Symp.*, pp. 160-165 (2006)).

Vorisek et al., "Improved Handling of False and Multicycle Paths in ATPG," PowerPoint Presentation Slides from *Proc. IEEE VLSI Test Symp.*, 19 pp. (2006).

* cited by examiner

GENERATING RESPONSES TO PATTERNS STIMULATING AN ELECTRONIC CIRCUIT WITH TIMING EXCEPTION PATHS

CROSS REFERENCE TO RELATED APPLICATIONS

This Patent Application is a continuation of U.S. patent application Ser. No. 11/478,120, filed Jun. 28, 2006 now U.S. Pat. No. 7,555,689, which claims the benefit of U.S. Provisional Patent Application No. 60/694,884, filed Jun. 28, 2005, both of which are incorporated herein by reference.

TECHNICAL FIELD

The field relates to generating accurate responses to stimulation of an electronic circuit during simulation of the electronic circuit, for instance.

BACKGROUND

Scan-based stimulation of electronic circuits with scan patterns of input signals is used widely for several purposes, including testing the accuracy of the circuit by comparing observed responses to expected responses. Test pattern generation methodologies have matured and have been widely applied in high volume manufacturing (HVM). However, conventional stuck-at scan patterns are no longer sufficient to achieve high product quality in nanometer technologies. Resistive bridges and vias, power drops, cross-talk noise effect and other such undesirable characteristics may manifest themselves in subtle timing changes that require at-speed tests to detect. As a result, at-speed testing has become a desirable ingredient for ensuring product quality in circuit manufacturing. At-speed scan patterns typically consist of a relatively slow initial scan operation followed by two or more fast clock events applied at or near functional frequency. One of the challenges in generating at-speed scan tests is avoiding false failures on the tester due to exercising paths in the circuit that are not designed to propagate logic values within a single clock cycle. These paths are generally referred to as timing exception paths, since they are "excepted" from the single clock cycle requirement for some reason. Accordingly, at-speed test patterns also refer to scan patterns containing multiple clock events either from the same clock or from different clocks at frequencies where such timing exception paths may affect circuit response. Timing exception paths include, but are not limited to, false paths, multi-cycle paths, conditional false paths, and conditional multi-cycle paths, for instance.

False paths include those paths in a circuit that are not exercisable in the functional mode of operation, but may be exercisable during scan-based stimulation, for instance. Static timing analysis tools typically ignore these false paths when determining the timing performance of an integrated circuit. Consequently, the signal propagation delay along a false path is usually not known. However, during scan-based testing a false path can be sensitized. A false path is considered sensitized, for instance, if a change in values at the input of the path causes a change in logic values at the output of the path. Such changes may include pure transitions (e.g., 1→0 or 0→1) or glitches (e.g., 0→1→0, or 1→0→1). Thus, the scan-in operation may load values into scan cells upstream of the false path that sensitize the false path with a value that would not ordinarily be produced during normal operation of the circuit. Because the signal propagation delay along the false path is typically not known, the sensitization of the false path can result in unknown states being produced. If these unknown states are not properly accounted for during response generation, the expected responses will likely be incorrect, resulting in circuit simulation results that are inaccurate.

For purposes of this disclosure, a multi-cycle path refers to a path of a circuit or circuit portion that has a signal propagation delay that is more than one clock cycle. Multi-cycle paths can also be sensitized during scan-based operations. Because a transition in the signal at the beginning of a multi-cycle path does not propagate to the end of the path in a single clock cycle, sensitization of a multi-cycle path will also result in the generation of unknown states. Again, if these unknown states are not properly accounted for during response generation, the responses produced will likely be incorrect. Conditional false paths are false paths defined with respect to Boolean conditions. If the associated condition is violated for some reason, the effect of the false path should desirably be considered.

The timing exception paths are typically derived from timing exception information and constraints provided by designers to Static Timing Analysis (STA) tools, synthesis tools, and/or layout tools. Among other things, they allow the tools to better optimize a design by relaxing timing constraints and overriding the default single-cycle clock constraint where specified. Timing exception data is usually provided in the form of constructs in Synopsys Design Constraints (SDC). Multi-cycle paths can also be derived from Standard Delay Format (SDF) data that specifies the timing information of cells and nets in a circuit.

To ensure correct operation of sequential circuit elements, data and control inputs are desirably held constant for specified time periods before and after any clock events. In this context, the time period that the inputs are desirably held constant before the clock event is referred to as setup time, and the time period that the inputs are desirably held constant after the clock event is called hold-time. A timing exception path with a setup time violation does not meet the setup time requirements. A timing exception path with a hold-time violation does not meet the hold-time requirements. Timing exception paths with setup time violations may affect the response of a circuit stimulated with at-speed scan patterns, whereas timing exception paths with hold-time violations may affect the response of a circuit stimulated with any scan pattern.

Transitions that propagate along timing exception paths during test pattern application can lead to capturing unreliable data. One way to handle these timing exception paths is to use cell constraints and/or to apply pattern masks at the starting points and the end points of the timing exception paths. By doing so, any transition that occurs at a starting point or end point of a timing exception path can be eliminated. This method, however, can produce pessimistic results, because the complete path information can be lost when generating cell constraints and pattern masks. Thus, the quality of a test may be unnecessarily poor. Further, the process of generating cell constraints and pattern masks is typically performed manually and is often tedious. Still further, for some complicated timing exception paths, the generation of a set of constraints and masks may not be possible. Thus, for instance, some of the test patterns produced may fail in the tester. Hence, the test coverage may drop, and the test quality may suffer. This also lowers the efficiency of on-chip scan compression schemes. Thus, reducing the unknown values in the response patterns is desirable for generating a complete set of responses, which in the testing environment, results in improving both test coverage and test compression, for instance.

SUMMARY

Described herein are methods and systems for generating accurate responses to stimulation of an electronic circuit in the presence of timing exception paths. In one aspect, scan patterns are applied over several time frames to the circuit comprising timing exception paths. For each of the scan patterns and each of the time frames associated therewith, it is determined whether end points of the timing exception paths are affected by unknown values being propagated thereto. The affected end points are masked and unknown values are injected at the affected end points and propagated forward. The resulting responses are captured at observation points in the circuit and used to generate an improved response to the stimulation of the circuit in the presence of timing exception paths. For instance, unknown values may propagate to the end points of the timing exception paths in at least some of the time frames associated with the scan patterns due to signal changes at the inputs of the paths that have timing violations such as set-up time violations and hold-time violations. Such changes may include transitions and glitches. In one aspect, timing exception paths are identified based on reading in design constraints. For instance, the starting points and end points of the timing exception paths can be identified based on reading the constraints. In one aspect, timing exception paths comprise circuit paths that are expected to be an exception to the default single-cycle clock constraints. Exemplary timing exception paths include but are not limited to false paths, conditional false paths, multi-cycle paths and conditional multi-cycle paths. In a further aspect, design constraints may include Boolean constraints and identifying timing exception paths based on the constraints may include identifying false paths that may be sensitized if one or more of the Boolean constraints are violated.

In another aspect, at least some of the timing exception paths are analyzed for determining whether they are sensitized by determining whether changes in input signals (e.g., transitions and glitches) observed at their starting points cause changes at their respective end points. In one aspect, the path sensitization check is implemented by checking whether unknown values injected at starting points with transitions or glitches are propagated to end points of those paths.

In another aspect, determining path sensitization check comprises determining which path should desirably be subjected to a path sensitization check. In one aspect, in a given time frame, a path determined to have been subjected to path sensitization check in a previous time frame may be selected to be subjected to a path sensitization check in the current time frame as well. In case of conditional false paths and conditional multi-cycle paths, whether the Boolean condition associated with these conditional paths has been violated is desirably verified before subjecting these paths to a path sensitization check. Any path determined to have violated set-up time constraints is desirably subjected to path sensitization check if a signal change such as a transition or a glitch is observed at their starting points. Any path determined to have violated hold-time constraints is subjected to a path sensitization check if a driver cell associated with the path has a clock that is active in the current time frame and the logic value at the input of the driver cell is different than its output in a time frame just before the clock is pulsed. In a further aspect, if multiple interacting clocks that are not skew-balanced are applied to share scan load and unload operations, improved response in this context can be generated by designating the paths between such interacting clocks as false paths with hold-time violations.

Additional features and advantages will become apparent from the following detailed description of illustrated embodiments, which proceeds with reference to accompanying drawings.

DETAILED DESCRIPTION

Figure 1A:
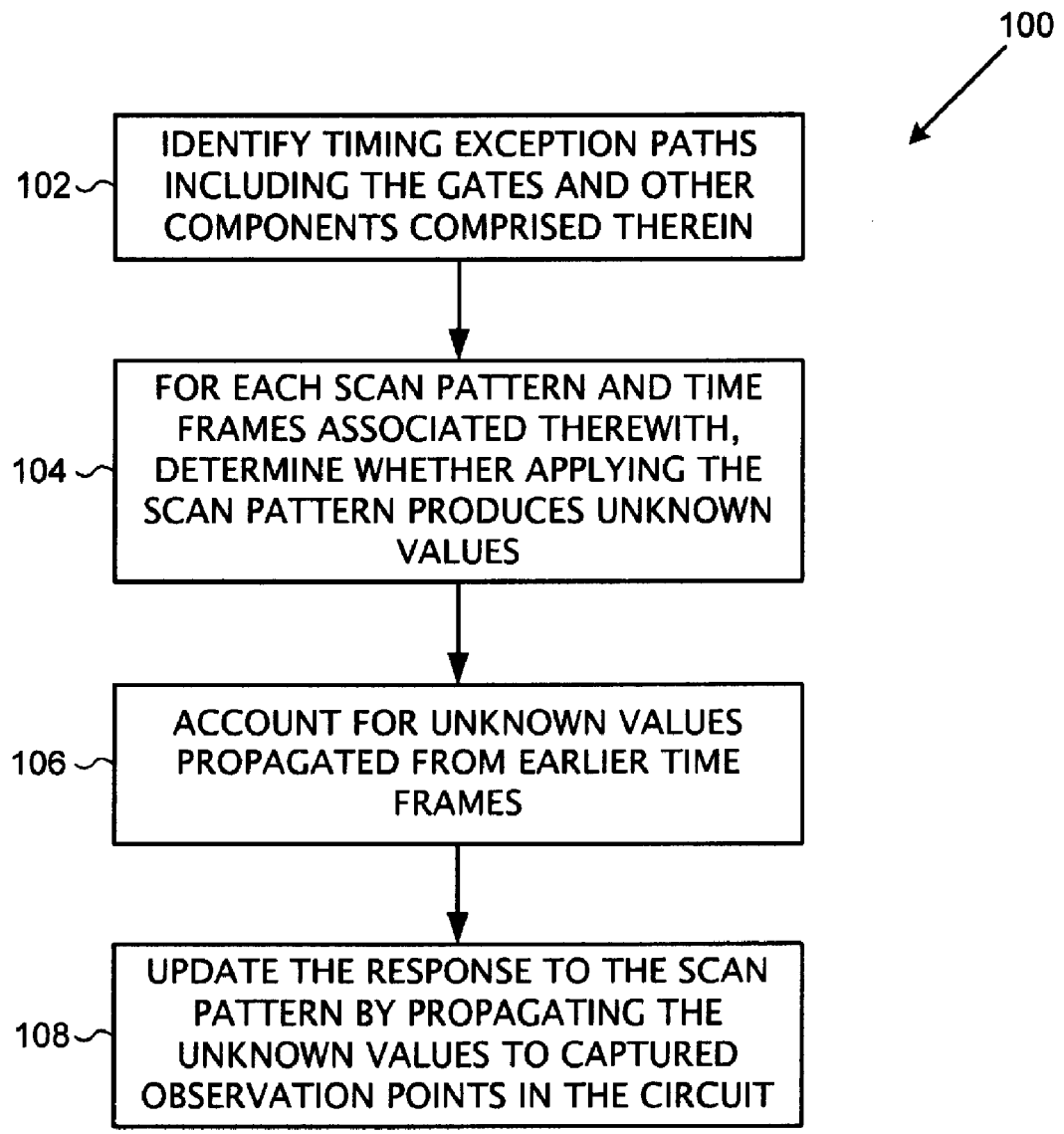
FIG. 1A is a flow diagram describing an exemplary overall method for generating responses to stimulation of an electronic circuit in the presence of timing exception paths.

Disclosed below are representative embodiments of methods, apparatus, and systems used for generating responses to stimulation of an electronic circuit. The methods, apparatus, and systems described herein may be used as part of a test pattern generation process (e.g., for use in an Automatic Test Pattern Generation (ATPG) software tool, an Embedded Deterministic Test (EDT) tool and/or a simulation tool). Certain embodiments of the disclosed technology produce responses that more accurately account for the presence of timing exception paths in a circuit. For example, the disclosed technology can be used to generate test responses for sequential test patterns applied at-speed (e.g., at or near the same frequency as the operational frequency of the circuit-under-test) or substantially at-speed (e.g., at a frequency at which the effects from one or more timing exception paths can impact test quality and are desirably considered). Moreover, embodiments of the disclosed technology can be used in connection with test patterns used to test a wide variety of fault models (such as, stuck-at, bridging, or such fault models) and are not limited to any particular fault or fault model.

Although, many of the examples described herein refer to the field of circuit testing and generating test responses to test patterns used in scan-based testing, the disclosed methods, apparatus, and systems should not be construed as limiting in any way by the context of such use. For instance, the methods described herein can also be used in any simulation tool. An existing pattern set can be loaded into the simulator. The simulator can simulate these patterns, and compute improved simulation responses in the presence of timing exception paths by applying the methods described herein.

The present disclosure is directed toward all novel and non-obvious features and aspects of the various disclosed methods, apparatus, systems, and equivalents thereof, alone and in various combinations and subcombinations with one another. The present disclosure is not limited to any specific aspect or feature, or combination thereof, nor do the disclosed methods, apparatus, and systems require that any one or more specific advantages be present or problems be solved.

Although the operations of some of the disclosed methods, apparatus, and systems are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods, apparatus, and systems can be used in conjunction with other methods, apparatus, and systems. Additionally, the description sometimes uses terms like "evaluate" and "determine" to describe the disclosed methods. These terms are high-level abstractions of the actual operations that are performed. The actual operations that correspond to these terms will vary depending on the particular implementation and are readily discernible by one of ordinary skill in the art.

The disclosed embodiments can be used to generate expected pattern responses for a wide variety of circuits (e.g., application-specific integrated circuits (ASICs) (including mixed-signal ASICs), systems-on-a-chip (SoCs), or programmable logic devices (PLDs), such as field programmable gate arrays (FPGAs)). Any of the methods or techniques described herein can be performed using software that comprises computer-executable instructions stored on one or more computer-readable media. Such software can comprise, for example, an electronic-design-automation (EDA) software tool, such as an automatic test pattern generation (ATPG) tool. Any such software can be executed on a single computer or on a networked computer system (for example, via the Internet, a wide-area network, a local-area network, a client-server network, or other such network). For clarity, only certain selected aspects of the software-based implementations are described. Other details that are well-known in the art are omitted. For example, it should be understood that the disclosed technology is not limited to any specific computer language, program, or computer hardware and that a wide variety of commercially available computer hardware can be used. For the same reason, computer hardware is not described in further detail.

One or more test responses that are produced by any of the disclosed methods, apparatus, and systems can also be stored on one or more computer-readable media and are considered to be within the scope of this disclosure. Computer-readable media storing such test responses may be accessed and used by a single computer, networked computer (such as those described above), or dedicated testing system (for example, a tester or automatic testing equipment (ATE)).

Any of the disclosed methods can be used to generate test responses in a computer simulation environment, wherein test patterns are applied to representations of circuits, which are stored on one or more computer-readable media. For example, the disclosed methods typically use circuit design information (for example, a netlist, HDL file (such as a Verilog or VHDL file), or GDSII file) and test pattern information stored on computer-readable media. For presentation purposes, however, the present disclosure sometimes refers to the circuit and its circuit components by their physical counterpart (for example, scan cells, primary outputs, paths, circuits, and other such terms). It should be understood, however, that any such reference in the disclosure or the claims includes representations of such circuit components as are used in simulation, ATPG, or other such EDA environments.

Further, certain aspects of the disclosed technology involve storing or retrieving data from one or more lists. As used herein, the term "list" refers to a collection or arrangement of data that is usable by a computer. A list may be, for example, a data structure or combination of data structures (such as a queue, stack, array, linked list, heap, or tree) that organizes data for better processing efficiency, or any other structured logical or physical representation of data in a computer system or computer-readable media (such as a table used in a relational database). Moreover, any of the lists discussed herein may be persistent (that is, the list may be stored in computer-readable media such that it is available beyond the execution of the application creating and using the list) or non-persistent (that is, the list may be only temporarily stored in computer-readable media such that it is cleared when the application creating and using the list is closed or when the list is no longer needed by the application).

An Exemplary Overall Method for Generating Accurate Responses to Stimulation of an Electronic Circuit in the Presence of Timing Exception Paths An exemplary general method 100 for generating responses to stimulation of a circuit using scan patterns is shown in FIG. 1A. The method 100 for instance, can be implemented in an exemplary context 200 illustrated in FIG. 2 within a response generation tool 210 (e.g., an ATPG tool, an EDT tool, and/or a simulator). At process block 102, timing exception paths, including gates, interconnects, and other components are identified. According to one exemplary embodiment, timing exception paths are identified from one or more design constraints file (e.g., 215 of FIG. 2) associated with a circuit design for which responses to stimulation by scan patterns are to be generated. The design constraints file (e.g., 215 of FIG. 2) ordinarily specifies the design intent for particular circuit design, including timing and area constraints for the design. Such files are typically used in STA tools (e.g., 220 in FIG. 2) for timing verification, for instance. An STA tool can determine whether set-up times and hold-times have been met throughout the design.

The information related to timing exception paths as specified in the design constraints file, may comprise, for example, information about one or more starting points of a path, a clock driving the one or more starting points, one or more ending points of a path, a clock driving the one or more ending points, one or more intermediate points along the path, respective clocks driving any such intermediate paths, or any other such information, including any combination or sub-combination thereof. The information related to timing exception paths could also include information indicating whether the paths have set-up time violations, hold-time violations or some combination thereof. The timing exception path information can be extracted from the design constraints file and stored in one or more separate data structures (for example, for use by a response generation tool 210 in FIG. 2).

Figure 2:
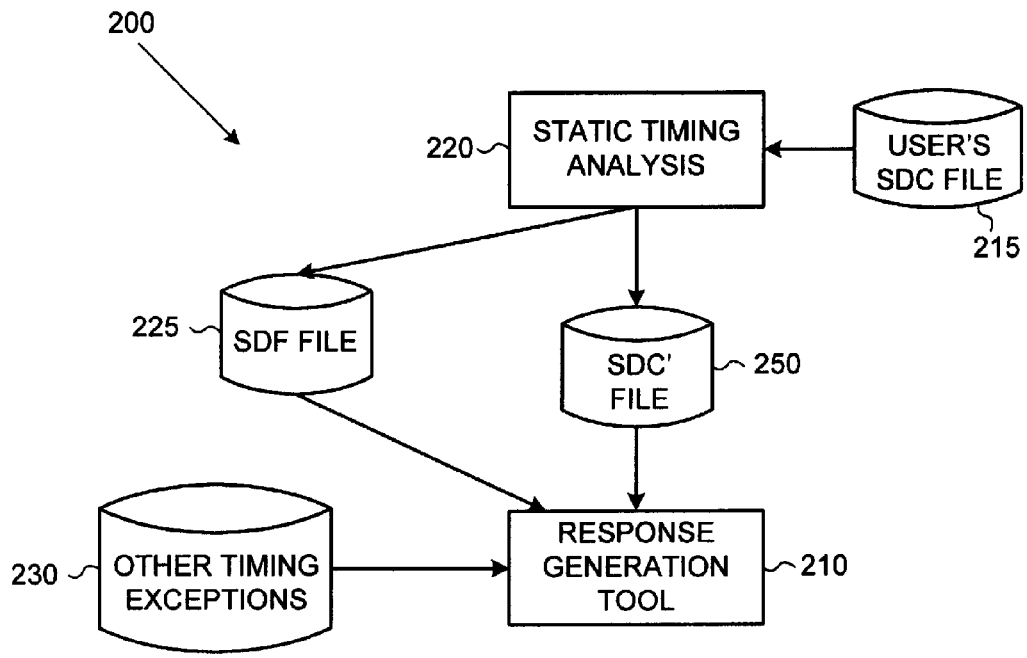
FIG. 2 is a block diagram describing an overall system for generating responses to stimulation of an electronic circuit in the presence of timing exception paths.
Figure 3A:
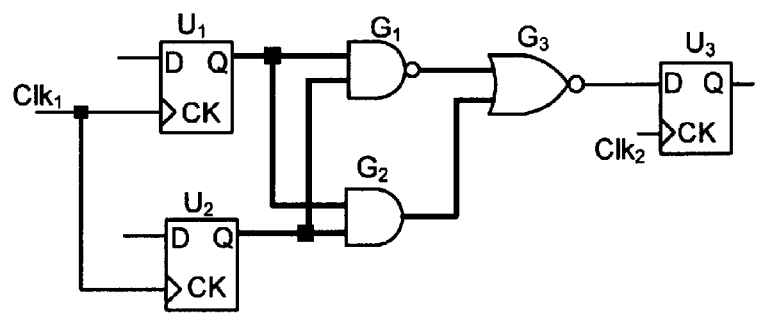
FIG. 3A is a block diagram illustrating an exemplary circuit comprising a false path across clock domains.

In particular implementations, the timing exception path information is extracted from an SDC file, such as the SDC file at 215 in FIG. 2. For example, a false path can be extracted from SDC commands set_false_path and set_disable_timing, and the multi-cycle path information can be extracted from SDC commands set_multicycle_path. These commands are provided with switches, such as -from, -to, and -through, accompanying design locations, such as I/O port names and internal pin path names. For example, consider FIG. 3A. The timing exception specification "set_false_path -from [get_clocks {$Clk_1$}] -to [get_clocks {$Clk_2$}]" causes the tool to exclude all the timing analysis between the two clock domains $Clk_1$ and $Clk_2$. Here all of the four paths from flip-flop $U_1$ and $U_2$ to flip-flop $U_3$ are considered as false paths.

Figure 3B:
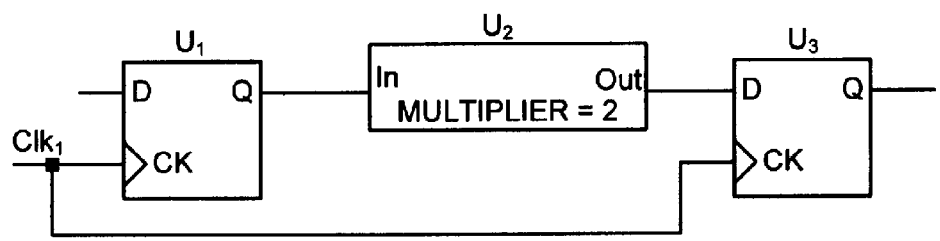
FIG. 3B is a block diagram illustrating an exemplary multi-cycle path.

A multi-cycle path is one in which the timing in the path is expected to take two or more cycles until it needs to have the expected result at the destination (or -to) point. For instance, referring to FIG. 3B, the timing exception specification "set_multicycle_path 2-from [get_pins {$U_1$/Q}] -through [get_pins {$U_2$/Out}] -to [get_pins {$U_3$/D}]" specifies that all the paths from flip-flop $U_1$ through multiplier $U_2$ to flip-flop $U_3$ are two clock cycles long. For these paths, the timing analysis tool will overwrite the default single-cycle set-up checks with two-cycle set-up checks. Another SDC command that disables specific paths is set_disable_timing. For instance, "set_disable_timing -from $I_2$ -to Z [get_cells {$G_1$}]" disables all the timing arcs through the input pin $I_2$ and through the output pin Z of gate $G_1$. Here, false paths are added through pin $G_1/I_2$ and through pin $G_1$/Z.

Figure 7:
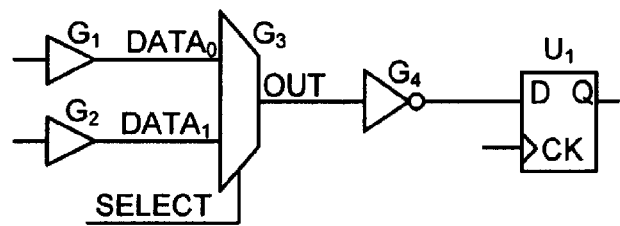
FIG. 7 is a block diagram illustrating an exemplary circuit with an exemplary conditional false path.

The SDC command set_case_analysis can be used to define Boolean constraints, which are used for determining conditional false paths. Referring now to the exemplary circuit of FIG. 7, for instance, the SDC command "set_case_analysis 1 [get_pins {$G_3$/select}]" is used to assign logic value 1 at the select line of a multiplexer gate $G_3$. Thus, in this example, only the $G_3$/$data_1$ to $G_3$/out path is considered for timing analysis. Paths $G_3$/$data_0$ to $G_3$/out and $G_3$/select to $G_3$/out will be treated as false paths. However, such false paths may get sensitized during stimulation by a scan pattern, if the Boolean condition does not hold true for some reason. As a result, such possible sensitization should desirably be accounted for in a response pattern.

Clocks can be defined in the STA tool (e.g., 220) for instance, with the two commands "create_clock" and "create_generated_clock". These commands have an optional -name switch where an "alias" name can be given to the created clock. This alias clock name can then be used as an identifier in other SDC commands.

Prior to response generation processing, a user-specified SDC file 215 may need to be modified. At a high level, the response generation tool 210 in FIG. 2 (e.g., (ATPG) software tool, (EDT) tool, and/or a simulation tool) reads a modified user-specified SDC file (e.g., SDC' file at 250) written out from the STA tool (e.g., 220) and identifies timing exception paths from the relevant commands. For instance, the "transform_exceptions" command within PrimeTime® by Synopsys®, a commercially available STA tool, can be used to preprocess the user-defined constraints 215 to clean up its contents to generate the modified SDC file (e.g., SDC' file at 250). Such clean-up may remove any redundant, invalid, and overridden path exceptions and timing exceptions within at-speed clock networks in a design. Desirably, it is this clean and updated SDC file (e.g., SDC' at 250) that is used by the response generation tool 210 for extracting timing exception paths for further processing. Further, the response generation tool 210 can directly read the SDC' file 250 before generating the response patterns. In addition to using SDC commands in an SDC file 215 to specify constraints, a user can directly specify timing exceptions 230 based on knowledge of the design, and the response generation tool 210 can use this information. Furthermore, multi-cycle paths can also be derived from SDF data (e.g., 225) that specifies the timing information of cells and nets in a circuit. Thus, methods and systems described herein for accurate response generation are not limited by the format in which the design constraints are specified.

Returning to the exemplary method 100 in FIG. 1, at process block 102, once the start and end points of the timing exception paths are identified from the design constraint information, during further analysis, the timing exception paths information is further processed to identify the gates or components of one or more of the timing exception paths. For example, a path cone marking process can be performed to identify the complete set of gates belonging to a timing exception path using forward and background cone tracing.

Figure 3C:
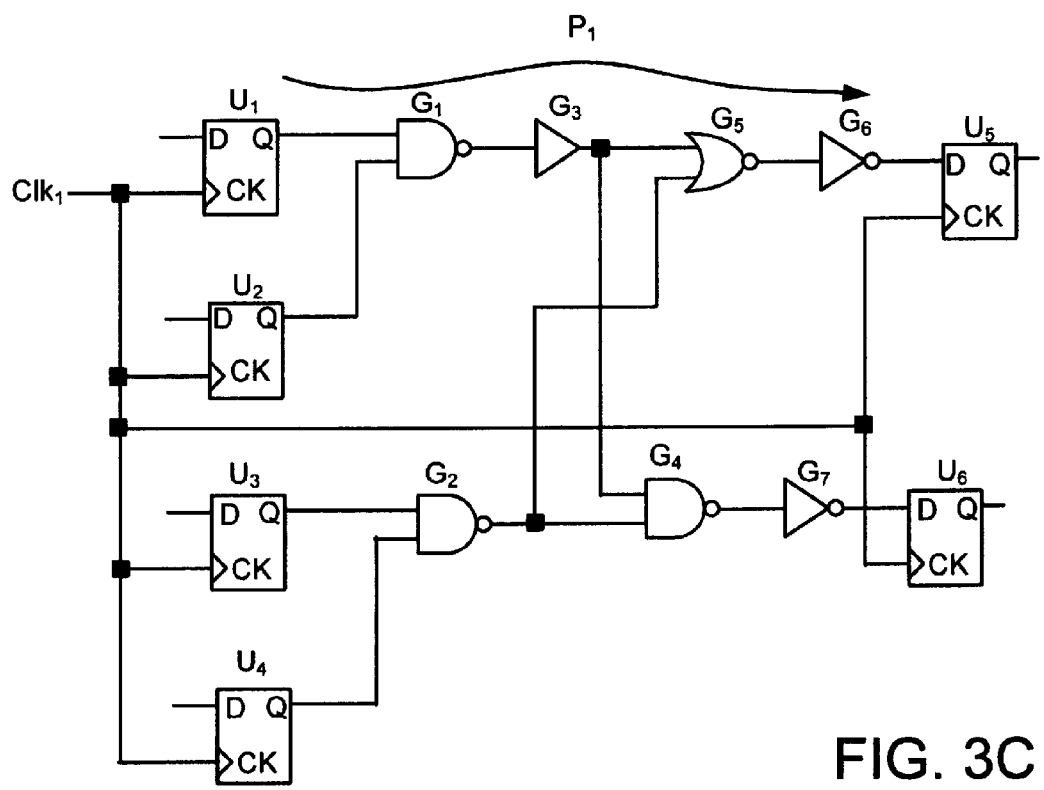
FIG. 3C is a block diagram illustrating a circuit comprising an exemplary timing exception path.

Consider, for example, the circuit shown in FIG. 3C. Let $P_1$ be a timing exception path from $U_1$/Q to $U_5$/D. The timing exception path $P_1$ consists of a single section with source node $U_1$/Q and sink node $U_5$/D. The gates $U_1$, $G_1$, $G_3$, $G_5$, and $G_6$ belong to both the forward cone of source node $U_1$/Q and the backward cone of sink node $U_5$/D. Hence, these gates define a complete specification of the timing exception path $P_1$ from $U_1$/Q to $U_5$/D, including the gates and interconnections comprised therein.

Figure 4:
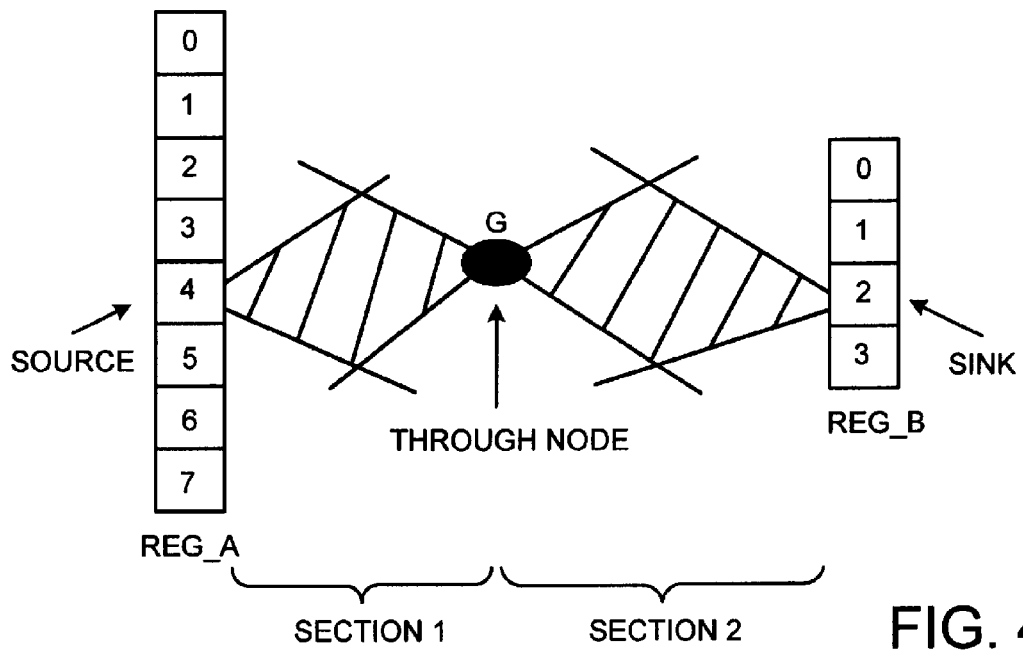
FIG. 4 is a block diagram illustrating an exemplary method of determining a timing exception path cone.

As another example of how the components of a timing exception path can be marked, consider the circuit shown in FIG. 4. An exemplary timing exception path is from Reg_A [4] to Reg_B[2] through the node G. This path can be said to have two sections: section 1, with a source node at Reg_A[4] and sink node at G, and section 2, with a source node at G and a sink node as Reg_B[2]. According to one exemplary embodiment, cone tracing is performed on each section separately (though in other embodiments, one or more sections may be considered together). Thus, according to the exemplary embodiment, section 1 consists of gates that are part of both the forward cone of source node Reg_A[4] and the backward cone of sink node G. In other words, in this exemplary embodiment, section 1 of the timing exception path consists of gates in the intersection of the transitive fanout gates from the source node Reg_A[4] and the transitive fanin gates from the sink node G. For purposes of this disclosure, the term "transitive fanout gates" refers to the downstream gates to which a signal from a respective source node can potentially propagate and includes gates on associated fan-out paths. For purposes of this disclosure, the term "transitive fanin gates" refers to the upstream gates that potentially contribute to the signal at a respective sink node and includes gates on associated fan-in paths.

Correspondingly, section 2 consists of the gates belonging to both the forward cone of source node G and the backward cone of sink node Reg_B[2]. Together, the identified gates in section 1 and section 2 define the complete timing exception path. These gates are illustrated in FIG. 4 as the shaded regions between Reg_A and Reg_B. For any arbitrary timing exception paths with N distinct sections, N forward, and N backward traversals will identify the gates that completely define the timing exception path.

Returning to FIG. 1A, at process block 102, in the presence of multiple timing exception paths in a given circuit, sets of interacting timing exception paths may need to be determined before further analysis for response pattern generation. For purposes of this disclosure, such sets are sometimes referred to as "path partitions". Identifying such sets can simplify the response generation process and improve the accuracy of the responses generated. According to one exemplary embodiment, two timing exception paths $P_1$ and $P_2$ are desirably identified as interacting paths and included in a path partition if at least one of the end points of one of the paths is part of the other path. In such a situation, signal propagation through one of the paths may potentially interfere with the other. The process of determining path partitions is described in further detail below. In some embodiments, the act of determining path partitions can be omitted.

At process block 104, the timing exception paths are evaluated to determine whether they produce unknown states upon application of a scan pattern (for example, the test pattern for which a test response is to be generated). This process is sometimes referred to as determining path sensitization of the timing exception path. According to one exemplary embodiment, this process involves determining whether an unknown state could propagate to the end of one or more timing exception paths (and/or path partitions) upon application of the scan pattern being analyzed. Further, the application of a sequential scan pattern (such as an at-speed test pattern) involves multiple time frames. Thus, in certain embodiments, unknown states resulting from each of the timing exception paths are desirably identified for each time frame associated with application the scan pattern.

Figure 1B:
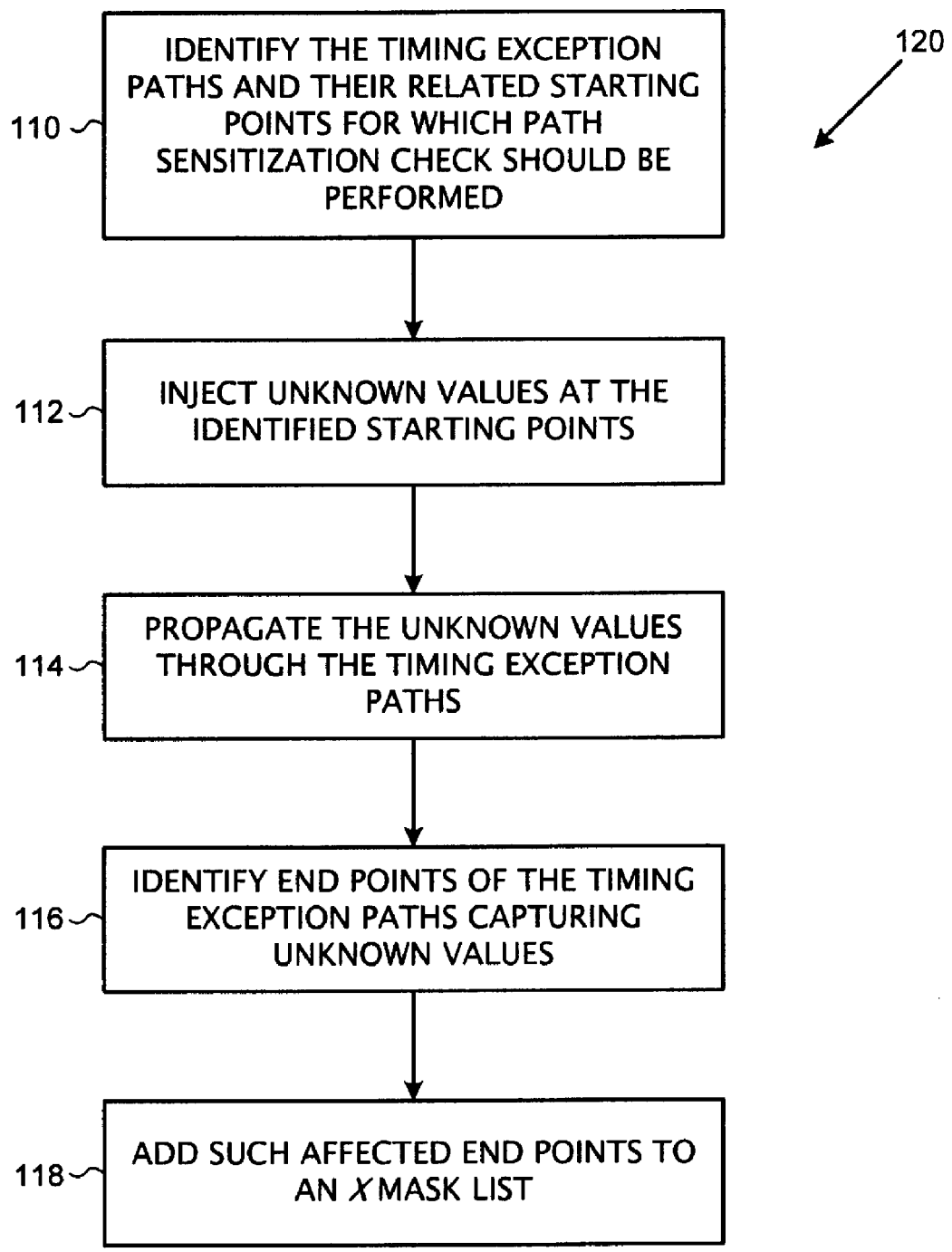
FIG. 1B is a flow diagram describing an overall exemplary method for verifying the path sensitization of a timing exception path.

One exemplary implementation of an overall path sensitization verification or check (e.g., process 120) is described with reference to FIG. 1B. The timing exception paths and the starting points associated therewith that should be subjected to path sensitization check are desirably identified at 110. A particular timing exception path could be subjected to a path sensitization check for several reasons, at least some of which are described in additional detail below (e.g., with reference to FIG. 14). For instance, if there is a signal transition between time frames (e.g., 0→1, or 1→0) at the point being examined and there is a set-up time violation along the path in question, the transition can cause unknown values to be propagated further down the circuit, therefore, a determination has to be made as to whether the associated path is sensitized. For example, in one particular implementation, at 112 a logic value of "X" (e.g., representing an unknown logic value) is injected. The value "X" is merely exemplary, it should be understood that any value or representation can be used to indicate the logic value at the starting point of the path in place of "X". At 114, the effect of the injected "X" is propagated forward through the gates of the timing exception path (for example, using a logic simulation, such as a smart event driven logic simulation). During the event driven simulation, the original logic value of a gate is stored for possible restoration, if the logic value "X" is found to propagate through the gate. After propagation through the path is simulated, at 116, the end points of the timing exception path capturing an "X" are identified. In this exemplary embodiment, if the logic value "X" is found captured at all of the end points or a subset of the end points associated with a path (and or a partition), the associated path(s) are determined to be sensitized. If none of the end points have captured a logic value "X", the timing exception path(s) is not considered to be sensitized. According to one particular implementation, at 118, the affected end points containing an "X" are stored in a separate list, referred to generally as the X-mask list. Thus, the X-mask list comprises affected end points of timing exception paths that are to be masked. The X-mask list is an exemplary implementation. Information regarding affected end points of paths can be stored and retrieved in other ways.

The exemplary path sensitization procedure described above should not be construed as limiting in any way, as other methods for determining whether the one or more timing exception paths are sensitized can be used. For example, in some embodiments, the sensitization conditions are represented as one or more Boolean conditions and the sensitization check is performed using a Boolean Satisfiability Solver. For instance, consider a circuit comprising an AND gate $G_1$ with three inputs $A_1$, $A_2$, and $A_3$, and an output Z. Suppose a false path $P_1$ is specified from input gate $G_1/A_1$ to output gate $G_1/Z$. Further suppose that the logic value at starting point $A_1$ at time frame t is specified as some variable $A_1(t)$. The sensitization check for $P_1$ can be expressed at least in part as two timed Boolean equations:

$$\{A_1(t)*(\sim A_1(t-1))\}+\{(\sim A_1(t))*A_1(t-1)\}=1 \quad \text{Equation 1}$$

$$A_2(t)*A_3(t)=1 \quad \text{Equation 2}$$

Note that in the equations above, "*" denotes a logical "AND" operation, "+" denotes a logical "OR" operation and "~" denotes a logical "NOT". Thus, in short Equation 1 returns TRUE (e.g., "1"), if there are transitions in logic values at gate $A_1$ between time frames (e.g., t and t−1). Equation 2 returns true if logic values at $A_2(t)$ and $A_3(t)$ are at "1." Thus, if both Equations 1 and 2 above return TRUE (e.g., "1") then whatever the value $A_1(t)$ of the starting point $A_1$ is in time frame t, it propagates to the end point of the path at $G_1/Z$. Thus, upon applying these two equations in a Boolean Satisfiability Solver, if the answer is "TRUE", then the path is determined to be sensitized. Otherwise, it is not sensitized. The equations above are exemplary. One can express path sensitization conditions for timing exception paths comprising many more logic gates as Boolean Satisfiability problem.

In embodiments in which one or more path partitions have been identified, each partition can be analyzed independently to determine whether they produce unknown states upon application of the test pattern being analyzed. In other embodiments, however, one or more partitions are considered together. In certain implementations, sensitization checks for two or more timing exception paths in a partition are performed simultaneously. For instance, in one implementation, all timing exception paths in a path partition are analyzed together. As discussed above, in one particular implementation, the sensitization check results in an X-mask list being produced that comprises the end points of the timing exceptions paths to which logic value "X"s were propagated during the sensitization check.

In some embodiments, there are multiple time frames in a given scan pattern. The unknown states, due to sensitization of these timing exception paths, are identified for each of these time frames. The sensitization checks of the timing exception paths are performed and the X-mask list is populated for each time frame. After populating the X-mask list, the original circuit state is restored. Then, returning to FIG. 1A, at 108, the logic value X is then injected at the circuit nodes belonging to the X-mask list and the effect of these unknown states is propagated forward by performing logic simulation. This can be performed, for example, in order to determine whether the unknown states will be propagated to the circuit nodes at which the response will be captured at the end of the test period and thus, whether the response should be updated to include any of the unknown states. Such nodes typically comprise scan cells, manually inserted observation points, or primary output pins (sometimes collectively referred to as "observation points").

Exemplary Methods of Accounting for the Effects of Past Time Frames

In one embodiment, when determining whether a timing exception path should be subject to a path sensitization check (e.g., 110 in FIG. 1B), at process block 106 in FIG. 1A, the effects of unknown values injected at its starting points in prior time frames may need to be accounted for in a current time frame of a given sequential scan pattern (such as an at-speed test pattern). For instance, suppose the current time frame is t and the false path $P_1$ has an at-speed transition at its input at a time frame less than t that required a path sensitization check. In this case, even though there is no current at-speed transition at the input of the false path $P_1$, a sensitization check (e.g., process 120 in FIG. 1B) is performed for this path at the current time frame t. This is done because the delay along a false path is unknown and the unknown values injected in past time frames may continue to affect the response. If the false path $P_1$ is found to be sensitized in current time frame, the affected end points are assigned the unknown logic value at the current time frame and the effects of these unknown states are propagated forward by performing a conventional logic simulation. However, events such as scan load/unload operations, and other slow clock events clear the past unknowns for future consideration.

In one embodiment, for multi-cycle paths with propagation delay d, any previous unknown values injected at the inputs in time frames less than t and greater than (t−d) are considered for a sensitization check. The sensitized multi-cycle paths are then handled according to the rules explained above for false paths.

Figure 5:
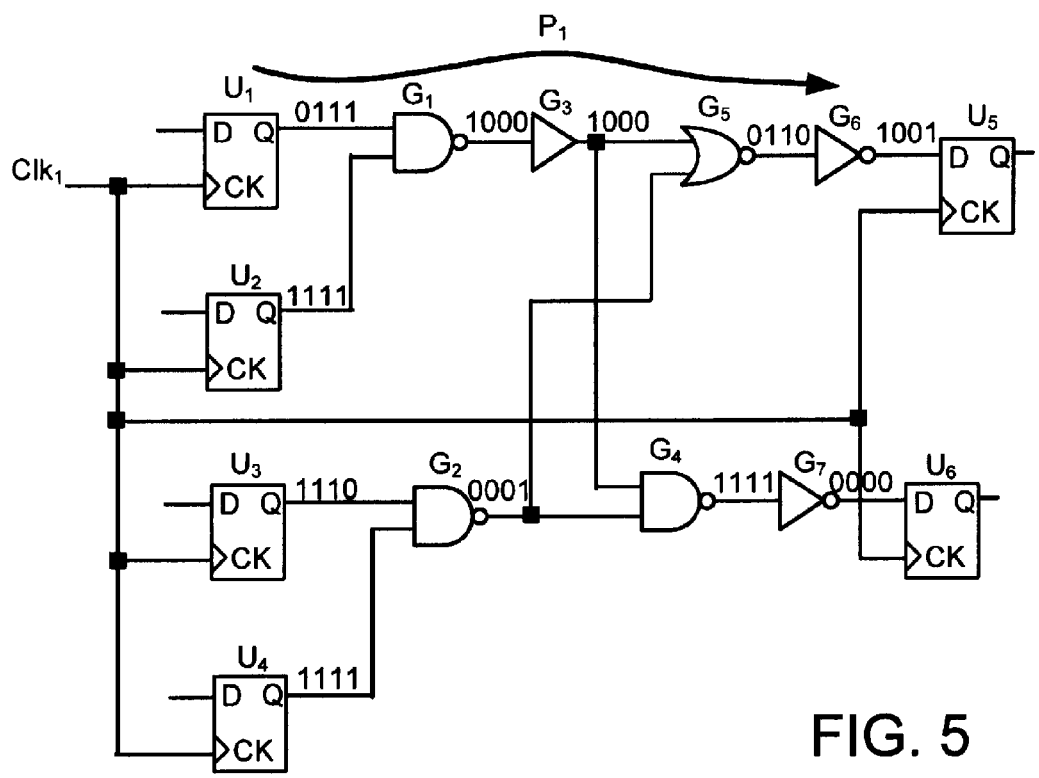
FIG. 5 is a block diagram illustrating an exemplary circuit with an exemplary timing exception path stimulated by an exemplary scan pattern in a plurality of time frames.

To illustrate the above exemplary method, consider the circuit with logic states for a given test pattern shown in FIG. 5. The exemplary scan patterns illustrated in FIG. 5 have four time frames $t_1, t_2, t_3$, and $t_4$ and are applied in that order. Logic states at point $U_1/Q$ are 0, 1, 1, and 1 in time frames $t_1, t_2, t_3$, and $t_4$, respectively. Logic states at $U_5/D$ are 1, 0, 0, and 1 in time frames $t_1, t_2, t_3$, and $t_4$, respectively. Suppose a false path $P_1$ between points $U_1/Q$ to $U_5/D$ is identified based on reading an exemplary SDC constraint "set_false_path -from [get_pins {$U_1/Q$}] -to [get_pins{$U_5/D$}]". Further, suppose that the identified false path is known to have a set-up time violation. The effect of this false path may need to be considered in order to generate an improved response pattern (e.g., a test response pattern).

Figure 6:
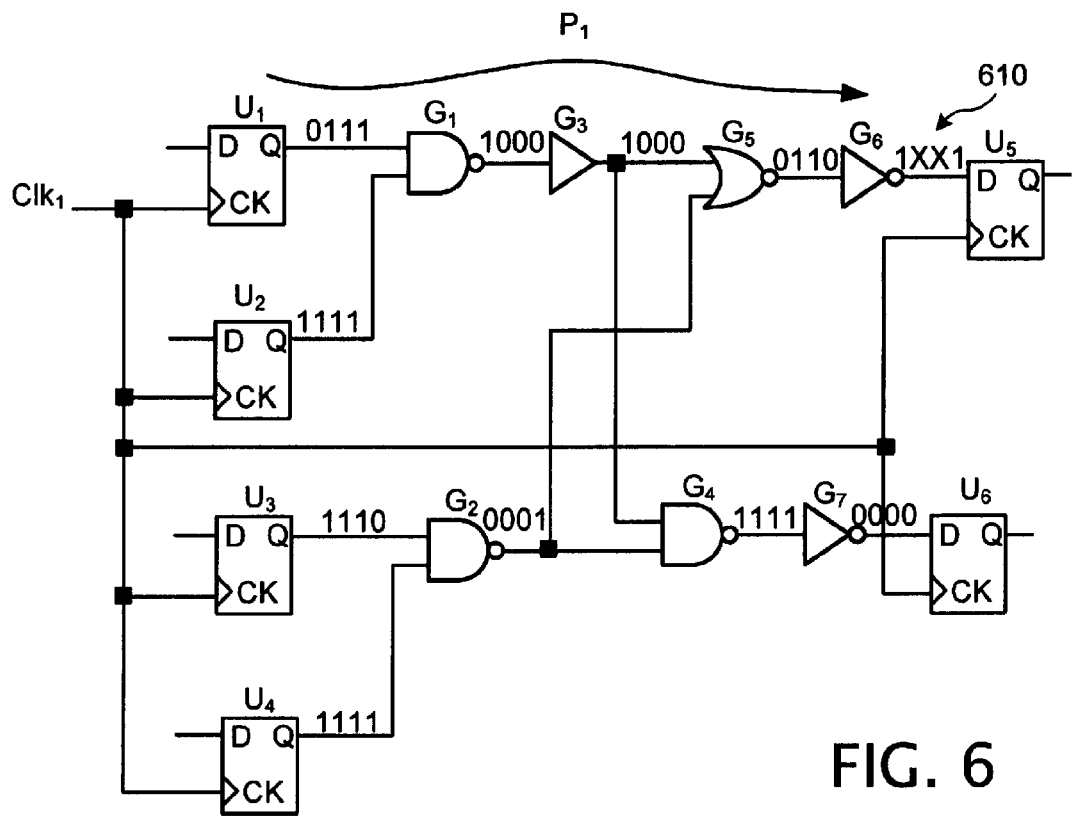
FIG. 6 is a block diagram illustrating an exemplary circuit with an exemplary timing exception path having unknown values propagated to its end points.

The effects are examined further with reference to FIG. 6. At time frame $t_2$, there is a rising transition (0→1) at $U_1/Q$ and as a result, in accordance to the process 120 of FIG. 1B, for instance, the false path sensitization check for $P_1$ is carried out. The false path $P_1$ is found to be sensitized, because an unknown value injected at $U_1/Q$ propagates to point $U_5/D$. $U_5/D$ is then assigned to logic value X in time frame $t_2$ (610) and the effect is propagated forward. At time frame $t_3$, there is no transition at starting point $U_1/Q$. However, there was a past rising transition (0→1) at $U_1/Q$ in time frame $t_2$ that required a path sensitization check. As a result, a path sensitization check for path $P_1$ is carried out in time frame $t_3$. The false path $P_1$ is found to be sensitized. $U_5/D$ is assigned to logic value "X" in time frame $t_3$ (610) as well and the effect is propagated forward. At time frame $t_4$, there is no transition at $U_1/Q$, but there was a past rising transition (0→1) in time frame in $t_2$ that required a path sensitization check. Thus, a false path sensitization check for $P_1$ is carried out in time frame $t_4$ and $P_1$ is found to not be sensitized. This is so because the logic value is 1 at time frame $t_4$ at the output of the gate $G_2$, which pulls the value of the NOR gate $G_5$ to low, halting the propagation of the unknown value "X" at gate $G_5$ along the false path being analyzed. As a result, the original logic state 1 is retained at $U_5/D$ in time frame $t_4$(610).

Exemplary Methods for Handling of Conditional False Paths

A conditional false path is a false path associated with a Boolean condition. If the associated condition is violated, the effect of the conditional false path may need to be considered. Conditional false paths can affect the responses if the associated Boolean condition is not satisfied. These paths can be derived from the Boolean constraints imposed by the SDC command "set_case_analysis", for instance. Consider the circuit of FIG. 7. One exemplary timing constraint for this circuit consists of SDC command "set_case_analysis 1 [get_pins {$G_3$/select]." In this case, an STA tool will typically use the logic state 1 of $G_3$/select line for computing delay. However, if for some reason this condition is violated during processing of a scan pattern, it can potentially lead to incorrect responses. In order to handle this situation effectively, a conditional false path through multiplexer $G_3$, along with logic condition 1 at $G_3$/select is added. If $G_3$/select is not at logic state 1, the effect of the false path through multiplexer $G_3$ is desirably considered. In addition to the conditional false path through the multiplexer $G_3$, a false path through the $G_3$/select pin is also designated, since an at-speed transition through this pin may also not be propagated reliably.

Figure 8:
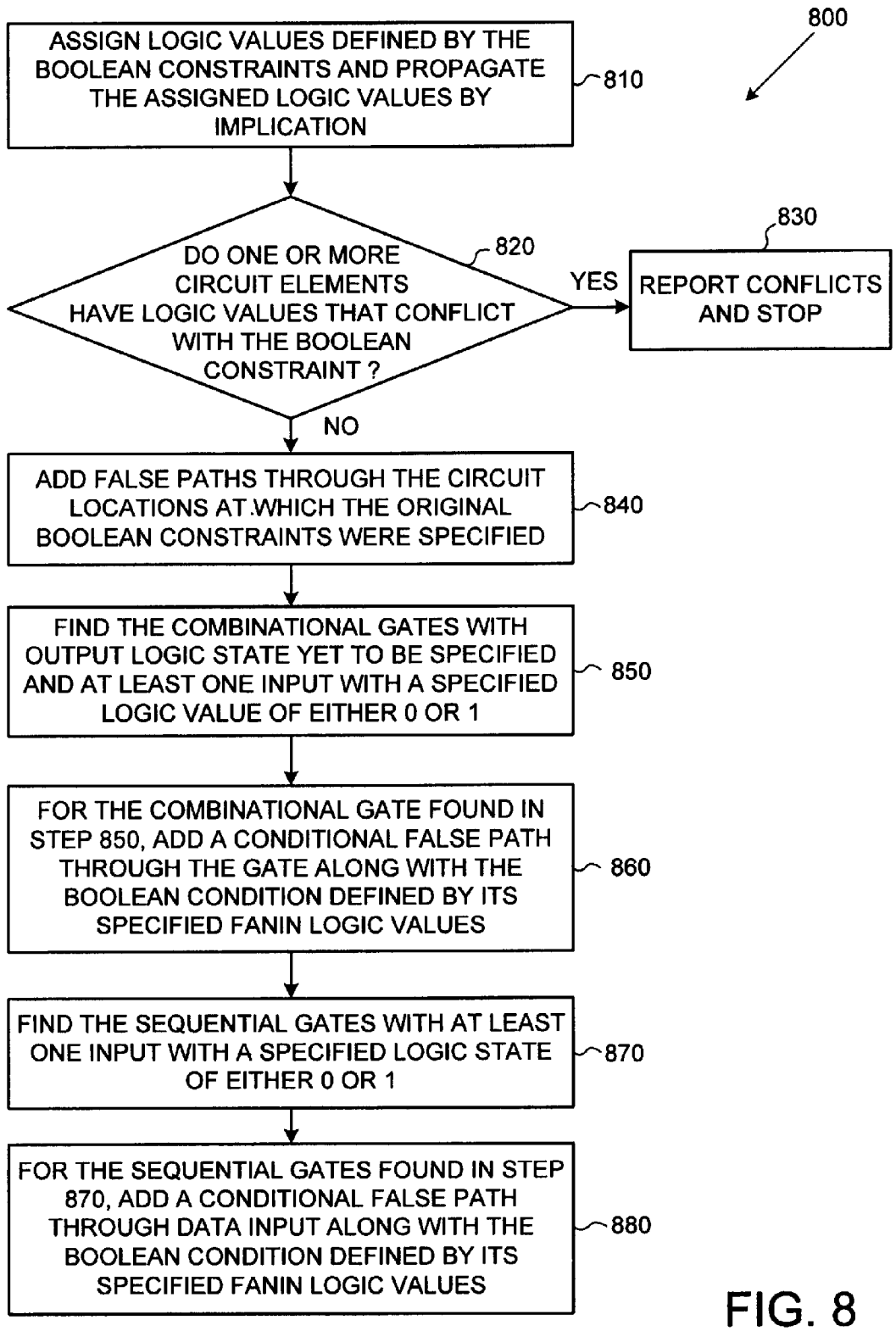
FIG. 8 is a flow diagram illustrating an exemplary method for deriving conditional paths from a set of exemplary Boolean constraints defined at circuit nodes.

An exemplary procedure 800 of FIG. 8 can be used to derive conditional false paths from a set of Boolean constraints defined at any circuit node. At 810, the effects of the Boolean constraints are propagated. The propagation may be based, for instance, on implying the logic values defined by the specified constraints. The propagation may also be based on logic simulation. During implication, at 820, the logical consistency of the constraints with logic values in other circuit elements is desirably checked to determine any conflicts that may exist. If at 820, the set of input Boolean constraints is logically inconsistent, then at 830, error reports are issued for reporting the conflicts and the process is stopped. If at 820, the specified Boolean constraints are not logically inconsistent, then at 840, the false paths are desirably added from the circuit locations where the Boolean constraints were originally specified. In one embodiment, the conditional false path (e.g., path through multiplexer $G_3$ in FIG. 7) and the select pin path (e.g., $G_3$/select pin in FIG. 7) are both added as false paths. Later, at 850 and 860, the conditional false paths are desirably derived for other combinational gates that may be affected. At 870 and 880, the conditional false paths are desirably derived for other sequential gates that may be affected.

Once the conditional false paths are identified, desirably, the Boolean condition associated with the identified conditional false path is examined to find out if it is satisfied before starting the path sensitization check according to the procedure 120 described with reference to FIG. 1B at 110. If the associated Boolean condition is violated the conditional false path may be subjected to the path sensitization check (e.g., according to process 1400 of FIG. 14 below).

Exemplary Methods of Handling Glitches

Figure 9:
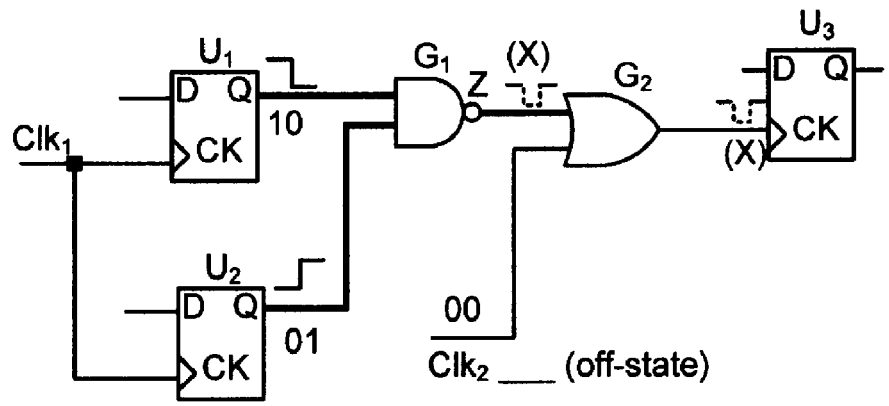
FIG. 9 is a block diagram illustrating an exemplary circuit for illustrating an exemplary glitch that could sensitize a timing exception path.

Like a signal transition, a "glitch" is another condition that can potentially sensitize a timing exception path. If the timing exception path sensitization is not considered due to a potential glitch, then the response generated for a scan pattern can be potentially incorrect. For example, consider the circuit of FIG. 9, having a timing exception path "set_false_path -through [get_ports $\{G_1/Z\}$]" through an NAND gate $G_1$ having an output Z and inputs $U_1/Q$ and $U_2/Q$. If the input $U_1/Q$ has a falling transition 1→0 and the input $U_2/Q$ has a rising transition 0→1, then the output Z can potentially have a "glitch." A glitch could be a static glitch (e.g., 0→1→0) where the transitions eventually returns the value back to the original values or dynamic glitch (e.g., 0→1→0→1). Without accurate delay information, it cannot be determined if there is any transition at point $G_1/Z$ of the false path. Assuming that the glitch happens as shown in FIG. 9, it results in an extra clock pulse at the flip-flop $U_3$ that is not simulated by a zero-delay simulator and may therefore cause unknown simulation results. In this case, $U_3$ should be masked. Therefore, for performing the path sensitization check, the unknown logic value "X" is injected at starting points of the path $U_1/Q$ and $U_2/Q$ of gate $G_1$ and simulated forward. This will result in an unknown logic value "X" being propagated to the output pin Z to gate $G_1$, and as a result, the path is determined to have been sensitized due to potential glitches.

In the circuit of FIG. 9, the starting point of the timing exception path is a sequential element $U_1/Q$. However, if a starting point is a pin of a combinational gate, then incorrect results may be produced when the potential glitches from elements beyond the path are ignored. To handle this situation correctly, the method described above for path sensitization check is enhanced by identifying a proper driver cell for timing exception paths in the presence of potential glitches. In one embodiment, a driver cell of a timing exception path is a sequential element, which drives the user defined starting points of the timing exception paths either through a simple net or through a set of combinational gates. When the user defined starting point of a timing exception path is itself a sequential element (e.g., as was the case with the circuit of FIG. 9), then the driver cell of the timing exception path is the specified starting point (e.g., sequential element $U_1$ of FIG. 9). Otherwise, the combinational input none of logic from the starting points is traced backward to find out all of the driver cells. To handle all the potential glitch scenarios during the path sensitization check, the signal transitions in the current and previous time frames are considered at the derived driver cells instead of user specified starting points. For instance, in one embodiment, "X"s are injected at the outputs of the driver cells with current or previous glitches, and the path sensitization checks are performed as described above. By doing so, any effects of potential glitches at the starting point of the timing exception paths will be accounted for. There is no need to go beyond the driver cells, since the glitches will not propagate through sequential elements.

In FIG. 9, the driver cells of the false path "set_false_path -through [get_ports $\{G_1/Z\}$]" are $U_1$ and $U_2$. Since both $U_1$ and $U_2$ have transitions at the second cycle, there is a potential glitch. As a result, "X" is injected at $U_1/Q$ and $U_2/Q$ and simulated forward. In this case, the unknown value "X" propagates to the clock port $U_3/CK$ and, as a result, the path is determined to have been sensitized and end point $U_3/D$ is added to the X-mask list to prevent mismatches.

Exemplary Methods of Handling of Hold-time Violations and Set-up Time Violations Set-up and hold violations are two timing check violations, which are typically identified by designers performing a static timing analysis, for instance. A set-up violation occurs if the cumulative delay along a path is too large to fit into the set-up time constraint window. On the other hand, a hold-time violation occurs if the cumulative delay along a path is too small to satisfy the hold-time requirement. If a timing exception path has a hold-time violation, it can be sensitized when a state element captures a new value, and that transition propagates downstream and gets captured into another state element within the same time frame. In this case, if the transition immediately following a clock pulse is not considered for a timing exception path sensitization check, it can lead to mismatches. However, during response generation, to minimize the computational overhead, in one embodiment, the effect of a newly captured state right after the clock being pulsed is desirably not immediately propagated. Instead, the following conditions are checked at the driver cells of the timing exception paths with the hold-time violation issues to find out potential transitions after the clock pulse:

Condition 1 ($C_1$): The logic value at the data input of the driver cell is different from the logic value at its output before the clock being pulsed.

Condition 2 ($C_2$): The clock associated with the driver cell will be active in the current time frame.

For sake of brevity, these conditions will be referred to hereafter as conditions $C_1$ and $C_2$. If both conditions are satisfied for a timing exception path determined to have a hold time violation then a path sensitization check is performed by injecting an "X" at the output of the appropriate driver cell. Once the injection is done, the rest of the process is as described above.

Figure 10:
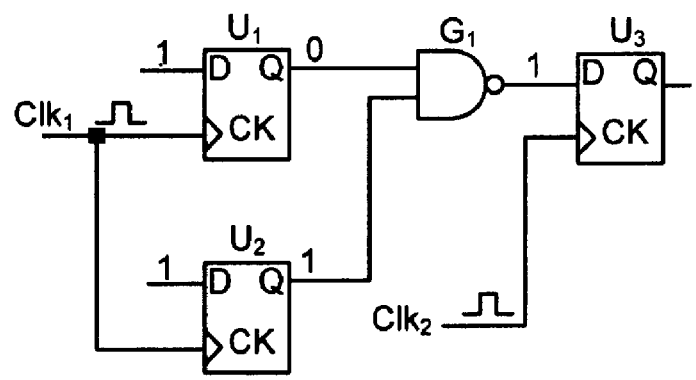
FIG. 10 is a block diagram illustrating an exemplary circuit for illustrating an exemplary hold-time violation that could sensitize a timing exception path.

Hold-time violations usually happen across different clock domains. FIG. 10 shows an example of the false paths from the clock domain $Clk_1$ to the clock domain $Clk_2$("set_false_path -from [get_clocks $\{Clk_1\}$]-to [get_clocks $\{Clk_2\}$] -hold"). When a scan pattern has a clock sequence pulsing both $Clk_1$ and $Clk_2$, there can be a hold-time violation from the flip-flop $U_1$ or $U_2$ to the flip-flop $U_3$. In this example, when the clocks $Clk_1$ and $Clk_2$ are pulsed, the new value 1 at the $U_1/D$ input of flip-flop $U_1$ creates a rising (0→1) transition on the output $U_1/Q$ of that flip-flop. This transition sensitizes the timing exception path from the flip-flop $U_1$ to the flip-flop $U_3$. If the clock $Clk_2$ arrives late at the flip-flop $U_3$, the new value 0 is captured at the flip-flop $U_3$ instead of the old value 1. This type of situation cannot be simulated properly without accurate timing information. However, the conditions $C_1$ and $C_2$ as described above are satisfied at the driver cell $U_1$. Hence, "X" is injected at $U_1/Q$ for path sensitization check. The path from flip-flop $U_1$ to flip-flop $U_3$ is found to be sensitized and the captured value at the flip-flop $U_3$ is set to "X", which results in $U_3$ being masked out.

Set-up time violations are handled as described before by looking for transitions in the current time frame. Thus, if set-up time is indicated to have been violated on a timing exception path and a transition is found to exist at the starting point of the path in a current time frame, then an "X" is injected at the appropriate starting point and propagated forward for verifying path sensitization.

It is worth mentioning that a timing exception path may be known to have both set-up and hold-time violations. If a design does not have the information of potential timing violations for the false path, then according to an exemplary pessimistic approach both set-up and hold-time violations are assumed to have happened. However, in the event more exact timing violation(s) of the false path is available, more accurate simulation can be done to reduce the test coverage impact. For instance, in an SDC file, "-hold" and "-setup" switches are used to indicate the violation type of a false path. Thus, in such conditions, the specific constraints expressed in the SDC file are followed. In yet another embodiment, when no such switch is specified, it is assumed that the false path violates just the set-up time. The multi-cycle paths with path-multiplier zero are also considered for hold-time violations. The timing exception paths with set-up time violations may affect a response related to at-speed patterns, whereas timing exception paths with hold-time violations may affect the response of any patterns.

Exemplary Methods of Handling Multiple Timing Exception Paths

Many of the examples described herein so far refer to a single timing exception path. However, there can be thousands of timing exception paths in today's nanometer designs. For a given timing exception path, a thorough analysis can be done by applying the techniques already discussed to find its impact on the test responses. There are several approaches to considering the effects of a plurality of multiple timing exception paths on the generated response patterns. For instance, one approach is to analyze each path individually. Another approach is to analyze at least some of these paths together. One such approach is based on forming static partitions of interacting timing exception paths. The partitions can be formed based on a static analysis step desirably performed prior to the per-pattern analysis (e.g., step 104 of FIG. 1A). During per-pattern analysis, paths in a given partition are analyzed together to determine their impact on the test responses. In one embodiment, the final test responses are computed by accumulating the effects from each partition.

Figure 11:
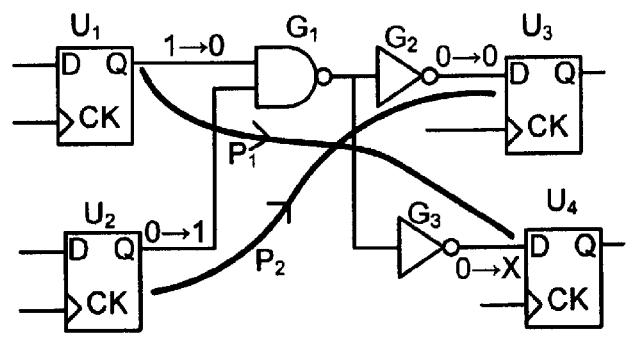
FIG. 11 is a block diagram illustrating an exemplary circuit comprising a plurality of independent timing exception paths.

Consider the circuit shown in FIG. 11. There are two false paths $P_1$ from flip-flop $U_1$ to $U_4$ and $P_2$ from $U_2$ to $U_3$. Suppose both paths are known to have set-up time violations. From $U_1$ to $U_3$, there is a true functional path and from $U_2$ to $U_4$, there is a true functional path. In this example, $P_1$ and $P_2$ have distinct end points (e.g., $U_3$ and $U_4$, respectively) and they are not driving any common points through any combinational paths. In the partitioning based approach, these are not interacting paths and as a result, these two false paths are desirably not analyzed together. The generated scan pattern has a falling (1→0) transition at $U_1/Q$ and a rising (0→1) transition at $U_2/Q$. Clearly the false path $P_1$ is sensitized due to the transition at $U_1/Q$ and a potential glitch through gate $G_1$. As a result, an unknown value "X" will be propagated to $U_4/D$ and the flip-flop $U_4$ should desirably be masked for this time frame. The false path $P_2$, on the other hand, is not sensitized since an unknown value "X" injected at $U_2/Q$ (while $U_1/Q$ is at 0 because path $P_1$ is analyzed separately) will not propagate to the end point of $P_2$ at $U_3/D$ and as a result, $U_3/D$ will remain at logic state 0.

On the other hand, suppose the $P_1$ and $P_2$ were determined to be interacting paths (for illustration purposes only), then unknown values "X" would be injected at both $U_1/Q$ and $U_2/Q$ (starting points for $P_1$ and $P_2$, respectively) simultaneously and as a result, both paths $P_1$ and $P_2$ would be sensitized, which would mean that flip-flops $U_3$ and $U_4$ would be masked.

Figure 12:
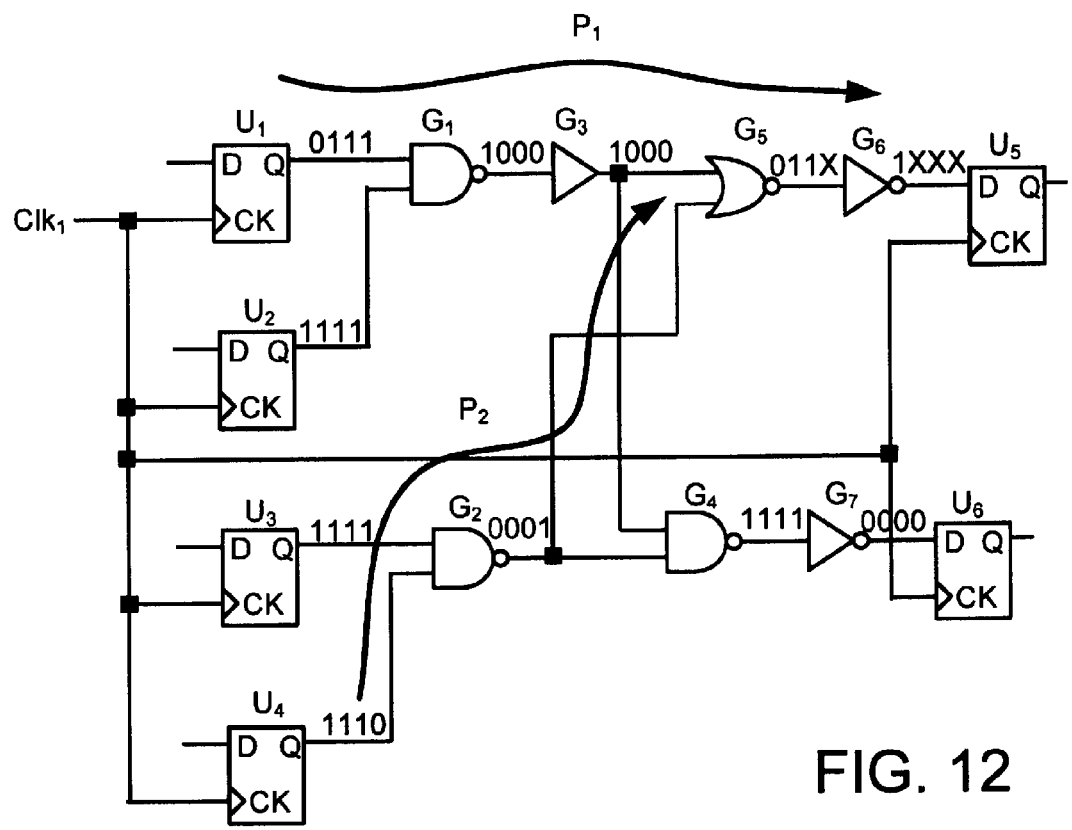
FIG. 12 is a block diagram illustrating an exemplary circuit comprising a plurality of timing exception paths that are interacting timing exception paths.

FIG. 12 illustrates exemplary timing exception paths $P_1$ and $P_2$, which are interacting time paths, since $P_1$ and $P_2$ have at least one element (e.g., $G_5$) in common. Therefore, paths $P_1$ and $P_2$ will form a partition and paths are analyzed together to determine their impact on the responses to stimulation by scan patterns. The results are captured as shown at end point $U_5/D$, which indicates that point $U_5/D$ should be masked at time frames $t_2$, $t_3$ and $t_4$.

Figure 13:
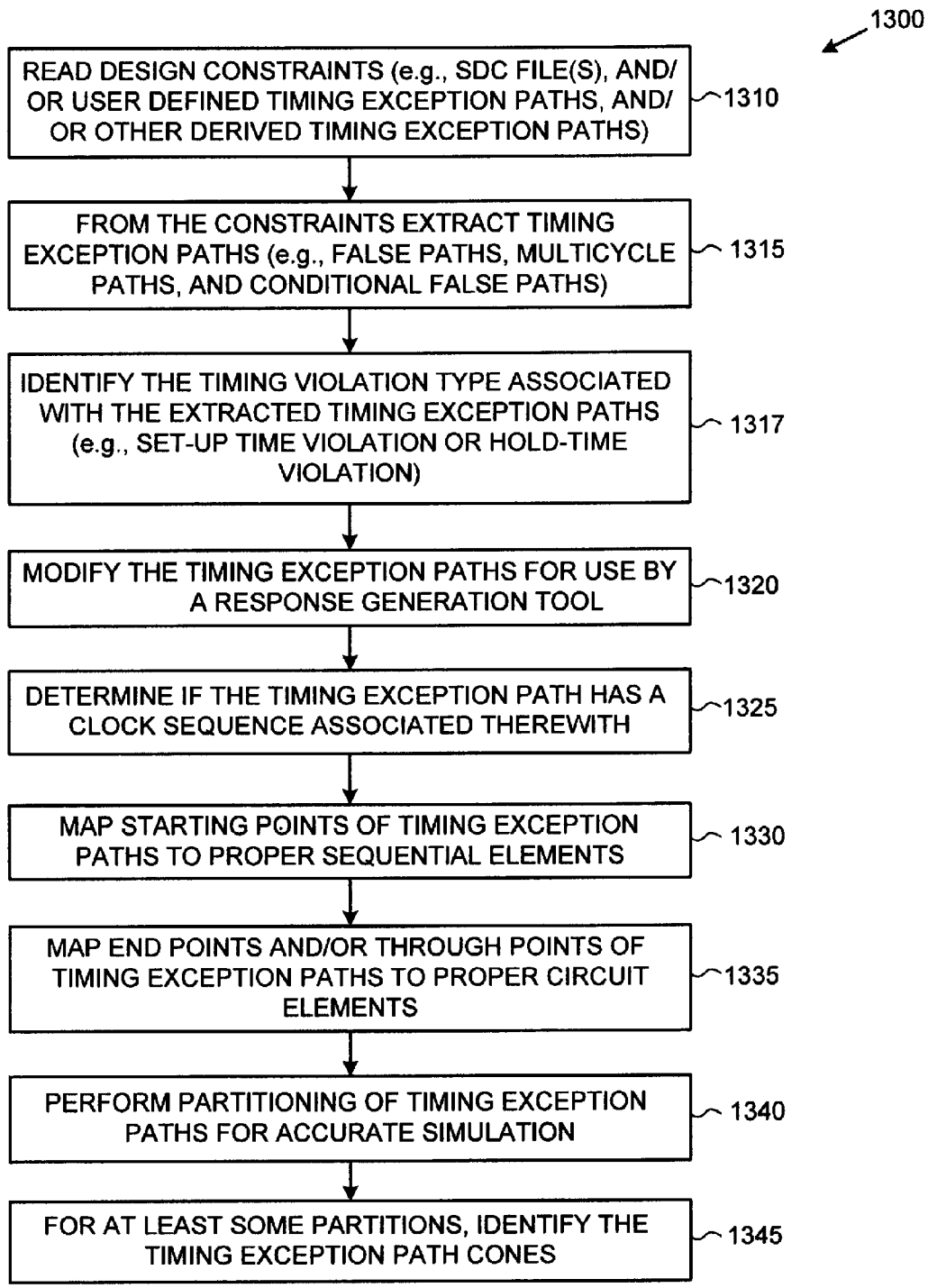
FIG. 13 is a flow diagram illustrating an exemplary method of static analysis desirably performed once per circuit for generating responses to stimulation of the circuit in the presence of timing exception paths.

Further Exemplary Methods of Generating Responses to Stimulation of an Electronic Circuit in the Presence of Timing Exception Paths Including a Static Analysis and a Per-Pattern Dynamic Analysis In some embodiments, methods for generating accurate responses to stimulation of an electronic circuit in the presence of timing exception paths can be implemented as an algorithm with several main procedures. For instance, in one particular embodiment a first procedure is a static analysis procedure (e.g., 1300 of FIG. 13) that is desirably executed once prior to beginning a response generation process. The second procedure is a dynamic analysis procedure (e.g., 1400 of FIGS. 14 and 1500 of FIG. 15) that is desirably executed per scan pattern or set of scan patterns over a plurality of time frames, for instance.

The procedure 1300 summarizes exemplary steps involved in static analysis and is desirably executed once for a given design and associated design constraints. The results generated from performing at least some of the steps of the procedure 1300 can be stored and retrieved as needed for the executing the dynamic procedure (e.g., 1400 of FIGS. 14 and 1500 of FIG. 15). At 1310, design constraints (e.g., one or more SDC files, and user defined timing exception paths) are read into the response generation tool (e.g., 210 in FIG. 2). The user-defined timing exception paths can be read into the response generation tool 210. Multicycle paths can also be derived from SDF 225 data that specifies the timing information of cells and nets in a circuit. Other derived timing exception paths can be read into the response generation tool 210. At 1315, timing exception paths, such as false paths, multicycle paths, and conditional false paths, are identified from the constraints. In case of conditional false paths, the procedure 800 of FIG. 8 is applied to derive the relevant false paths and conditional false paths. At 1317, the type of timing violation associated with the timing exception path(s) being analyzed is determined (e.g., by reading switches such as, "-set-Up" or "-hold"). At 1320, timing exception paths are desirably modified as described above so that they can be used for response generation. For example, if a timing exception path is defined through all primary inputs, the clocks are removed. The timing exception paths without any logic gates are also removed. The timing exception paths defined in fast clock network are also removed in some circumstances, to enable proper at-speed testing, for instance. At 1325, the timing exception paths are analyzed to determine if a particular clock sequence needs to be applied in order to activate a timing exception path. This will be useful in excluding the timing exception path from further analysis, such as path sensitization check, if at some time frame the associated clock is not applied, for instance.

At 1330, the user specified starting points of timing exception paths are mapped to proper sequential elements. For the timing exception paths defined through pins of combinational gates, the starting points are desirably mapped to the driver cells (e.g., as described above with respect to glitches). For cross-clock domain timing exception paths, the starting points are desirably mapped to the sequential elements controlled by the launch clock(s) in the from-list (e.g., in FIG. 3A, the user specified false path starting point at $Clk_1$ is mapped to output pin $U_1/Q$ of the sequential element $U_1$ controlled by the clock $Clk_1$). For the timing exception paths defined from the clock ports of sequential elements, the starting points are desirably mapped to the respective sequential elements. For the rest, the starting points are desirably mapped to original sequential elements specified in the from-list.

At 1335, the end points and/or through points are desirably mapped to proper circuit elements. For cross-clock domain timing exception paths, the end points are desirably mapped to the data/address inputs of sequential elements controlled by the capture clock(s) in the to-list (e.g., in FIG. 3A, user defined end point $Clk_2$ is mapped to an end point for analysis as input port $U_1/D$ of the sequential element $U_1$ controlled by the clock $Clk_2$). Other nodes are desirably mapped to the originally defined circuit elements. At 1340, static partitions of the timing exception paths are desirably formed to reduce the pessimism in simulation results as described above with reference to methods for handling multiple timing exception paths. At 1345, the timing exception path cones are identified for the paths in a partition. In one embodiment, it is the timing exception path cones that define the "X" simulation area for path sensitization checks. This information is used in dynamic per-pattern/per-time-frame analysis (e.g., 1400 of FIGS. 14 and 1500 of FIG. 15).

Once the static analysis procedure (e.g., 1300) is completed, the results generated in that procedure are used in the dynamic analysis procedure (e.g., 1400 of FIGS. 14 and 1500 of FIG. 15), which is desirably performed on a per-pattern/per-time-frame basis for at least some of the scan patterns (in their associated time frames). During the per-pattern/per-time-frame analysis, the timing exception path(s) and/or partition(s) are desirably analyzed for determining whether transitions and glitches cause unknown values to be propagated to points along the timing exception paths to affect the circuit's response to excitation by the scan pattern. Path sensitization of the timing exception paths are verified to account for such unknown values. However, in one embodiment, not all timing exception paths need be subjected to path sensitization check.

Figure 14:
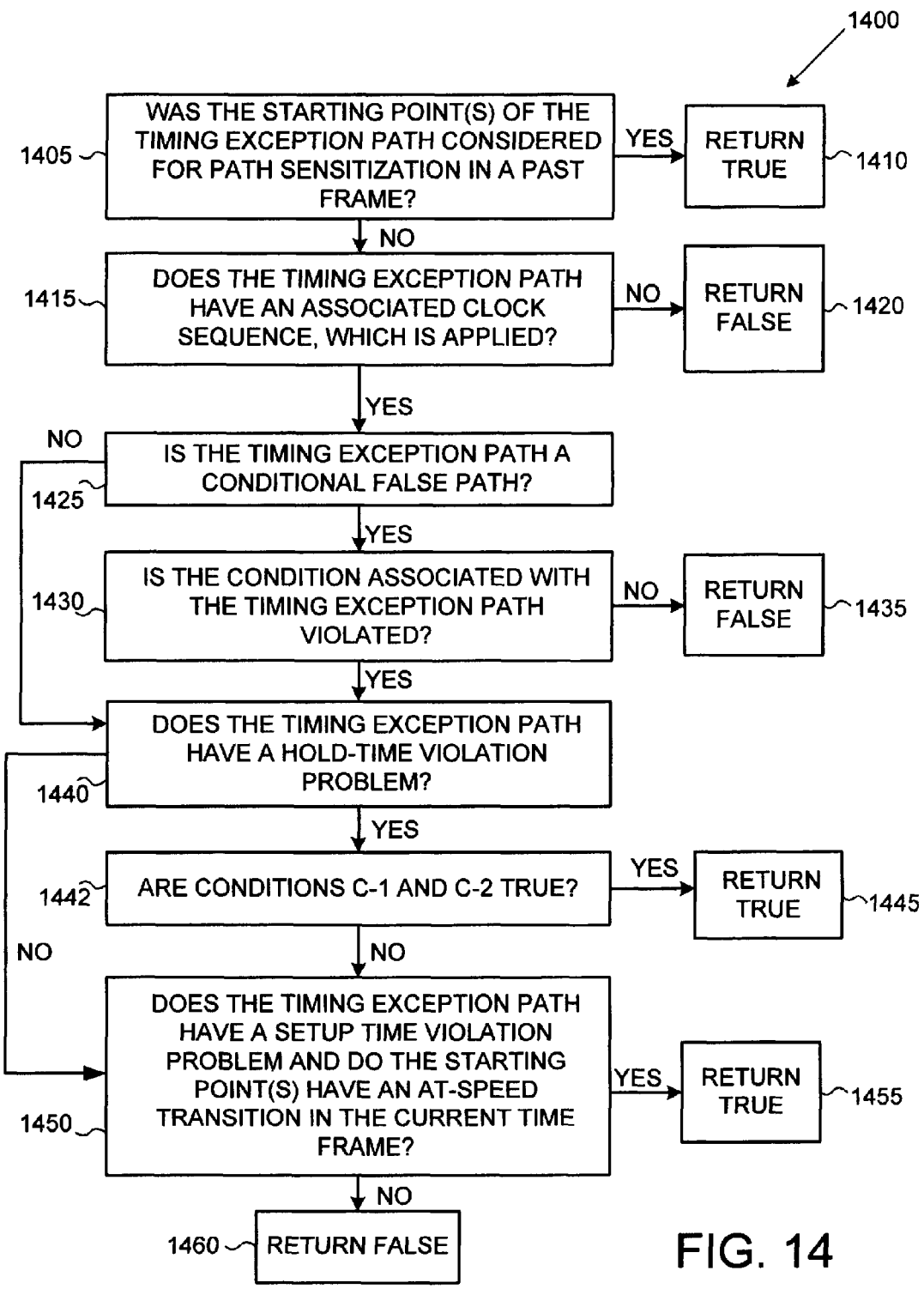
FIG. 14 is a flow diagram illustrating an exemplary method of at least a portion of the dynamic analysis performed on a per-scan pattern/per-time-frame basis including evaluation of at least some of the conditions under which a timing exception path will be subjected to a path sensitization verification process.
Figure 15:
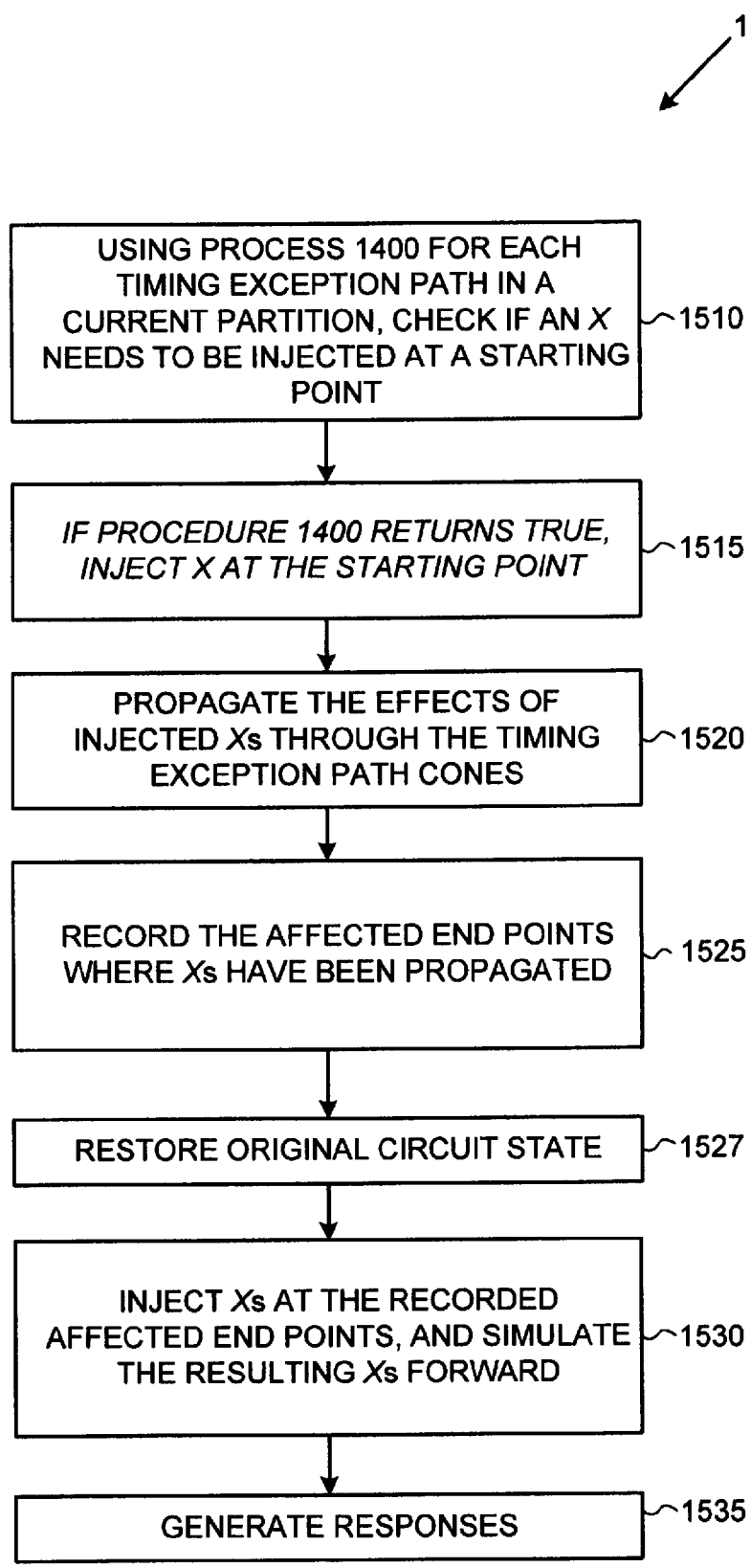
FIG. 15 is a flow diagram illustrating an exemplary method of at least a portion of the dynamic analysis performed on a per-pattern/per-time frame basis including an exemplary path sensitization verification process.

The exemplary procedure 1400 of FIG. 14 describes at least some of the conditions under which timing exception paths are subjected to path sensitization check (e.g., 120 of FIG. 1B) by injecting unknown values (e.g., "X"s) at the starting points of the paths. Desirably, at least some of the steps of this procedure 1400 are applied on a per-pattern and per-time frame basis. If at a step of the procedure 1400, the appropriate condition for injecting unknown values returns true, the procedure 1500 of FIG. 15 for verifying whether the unknown value propagates to end points of the appropriate paths (e.g., 1500 of FIG. 15) is initiated.

At 1405, the effect of the past time frames is analyzed by determining if the timing exception path was considered for a path sensitization check in a past time frame. If so, the procedure 1400 returns true at 1410 and the path in question is subjected to path sensitization check in the current time frame. If not, the procedure moves to 1415. At 1415, if a timing exception path has an associated clock sequence and the associated clock is not applied, then it is almost certain that a path sensitization analysis will not be valid. As a result, in one embodiment, if the associated clock sequence is not being applied, then at 1420, the procedure 1400 returns a false. If the associated clock is applied, the process moves on to 1425. At 1425, if the timing exception path is not a conditional false path then the process moves on to 1440. On the other hand, at 1425, if the timing exception path is a conditional false path and at 1430, the condition associated with the conditional false path is not violated, then at 1435, the procedure at 1400 returns false and no handling is required for this path. However, at 1430, if the condition is violated, then the process moves on to step 1440.

At 1440, conditions for verifying path sensitization of the timing exception paths with potential hold-time violations are examined by first determining whether the path has a hold time violation, if not the process moves on to 1450. However, if there is a hold time violation then in one embodiment, as described above, if at 1442 conditions $C_1$ and $C_2$ are determined to be true, the process at 1445 returns true and the path is selected for a path sensitization check.

At 1450, the conditions for verifying the path sensitization of timing exception paths with set-up time violations are checked. In one embodiment, at 1450, if a set-up time violation is indicated for a path and its starting point has a transition in the current time frame, then at 1455, the process returns true and the path is subjected to a path sensitization check. If the condition at 1450 is not true then the process 1400 returns false at 1460. For any of the conditions described above, if the process 1400 returns true (e.g., as 1410, 1445 and 1455), according to one embodiment, the path in question is selected for a time path sensitization check, which can be performed in accordance with process 1500 of FIG. 15. Thus, a path need only satisfy any one of the conditions of FIG. 14 to be selected for a path sensitization check. For instance, a path sensitization check may be performed due to a hold time violation or a set-up time violation or both.

The procedure 1500 describes the steps involved in a path sensitization check and a further propagating the unknown values captured at the affected end points in a dynamic per-pattern basis. Accordingly, it is desirably applied to each time frame in a given scan pattern. At 1510, the exemplary process 1400 of FIG. 14 is executed to determine if a path should be subjected to a path sensitization check. At 1515, if the process 1400 returns true, then unknown logic values (e.g., "X"s) are injected at the relevant starting points. At 1520, the effects of the unknown values are propagated through the timing exception paths and, at 1525 the affected end points are recorded. These affected end points have logic state "X" at the end of the path sensitization check. As noted above, the unknown values generated during propagation values may be temporary so at 1527, the original circuit state is restored and at 1530, "X"s are injected at the affected end points and the effects of these "X"s are propagated forward to the down stream logic to generate improved responses at 1535. It is these "X"s that are permanent in the response pattern and they could be used to alter the final at-speed responses, if they propagate to observation points downstream in the circuit.

Exemplary Methods of Generating Responses to Stimulation of a Circuit while Applying Multiple Clocks Simultaneously In some cases scan patterns for exciting a given circuit are applied across a plurality of clocks which control the timing of the various scan cells. When response patterns for such excitation is generated for each clock domain separately, the data volume and time associated with the response generation may increase significantly since the scan load and unload operations are not shared among the clock domains. This situation can occur for any testing of a circuit, including slow tests for stuck-at faults, for instance. In one embodiment, test compression can be achieved if multiple clocks can be applied simultaneously and the scan load/unload operations are shared.

However, when multiple clocks are applied simultaneously, the generated responses may not correct for scan patterns because at least some of these multiple clocks can be interacting and not skew-balanced. In this case, the methods described herein for generating responses in the presence of timing exception paths can be applied to generate improved test patterns, and achieve high test coverage and test compaction. In one example, false paths with hold time violation are added between any pair of clocks that are interacting and not skew-balanced. Then responses are generated by simultaneously pulsing multiple clocks in the presence of these false paths with hold time violations. The method described above for path sensitization checks are applied, and the affected end points of the sensitized paths are masked out and the final responses in the multiple clock domains are updated by propagating the unknown values to downstream logic as described above.

Exemplary Results

In this section, results from applying at least some of the methods described herein to five circuit designs are presented. All five designs have AC scan mode support for transition delay scan patterns. They all have PLL based internally generated AC scan clocks and the clock waveforms are configurable though a JTAG interface. Table 1 below shows some of the detailed characteristics of these five designs.

TABLE 1

Testcase Characteristics

| TESTCASES | CLOCK DOMAINS | MAXIMUM CLOCK SPEED | GATES | SCAN CHAINS | SCAN CELLS |
|---|---|---|---|---|---|
| C1 | 7 | 162 MHz | 3.7M | 512 | 160K |
| C2 | 7 | 108 MHz | 3.5M | 1004 | 128K |
| C3 | 96 | 96 MHz | 3.8M | 128 | 160K |
| C4 | 52 | 528 MHz | 2.8M | 95 | 162K |
| C5 | 15 | 372 MHz | 1.5M | 128 | 120K |

For each of these five designs, SDC files generated for the place and route tool by the static timing analyzer were used. From these SDC files, the cell constraints for the timing exception paths were also generated.

The at-speed test patterns were generated in three distinct ways. For the first flow called baseline flow (see Table 2), test patterns were generated without reading in SDC information and cell constraints information. If these patterns are used on an ATE as generated for at-speed testing there will likely be a lot of mismatches. Hence, these patterns are likely unusable for screening any real small delay defects in the absence of any instrumentation. In the second flow, called static masking flow, the cell constraints were read in, and at-speed test patterns were generated using this information. These patterns can be used on ATE as generated to screen small delay defects. In the third flow, called SDC flow, the tool directly read in one or multiple SDC files and created at-speed test patterns using timing exceptions and constraints specified in the SDC files. In the SDC flow, the tool used at least some of the method described herein to generate response patterns in the presence of timing exception paths. An ATE can use these patterns to screen small delay defects.

Table 2 shows the at-speed test generation statistics using the three flows described in the above paragraph. The SDC flow using the methods described herein produces at speed test patterns with test coverage 1.06% to 16.59% better than the static masking flow using the convention cell constraints method. The average number of unknowns per-pattern in the SDC flow is 3 to 50 times lower than that in the static masking flow. The methods described herein for generating at-speed patterns in the presence of timing exceptions and constraints by directly reading in SDC files improves thus, the quality of test (e.g., FIG. 13-15).

TABLE 2

Test Generation Statistics

| TESTCASES | TEST COVERAGE (%) | | | #PATTERN (K) | | | UNKNOWNS/PATTERN | | |
|---|---|---|---|---|---|---|---|---|---|
| | BASELINE | STATIC MASKING | SDC | BASELINE | STATIC MASKING | SDC | BASELINE | STATIC MASKING | SDC |
| CI | 82.28 | 77.40 | 78.46 | 16.0 | 20.5 | 20.4 | 100 | 26531 | 5848 |
| C2 | 97.56 | 92.89 | 95.83 | 8.4 | 13.5 | 12.3 | 118 | 1602 | 367 |
| C3 | 79.21 | 61.38 | 77.97 | 15.7 | 17.1 | 16.9 | 205 | 51302 | 929 |
| C4 | 81.03 | 73.33 | 78.46 | 30.0 | 30.0 | 30.0 | 800 | 4900 | 1500 |
| C5 | 84.05 | 76.26 | 80.28 | 13.9 | 12.3 | 12.4 | 29 | 405 | 94 |

Exemplary Computing Environments

Figure 16:
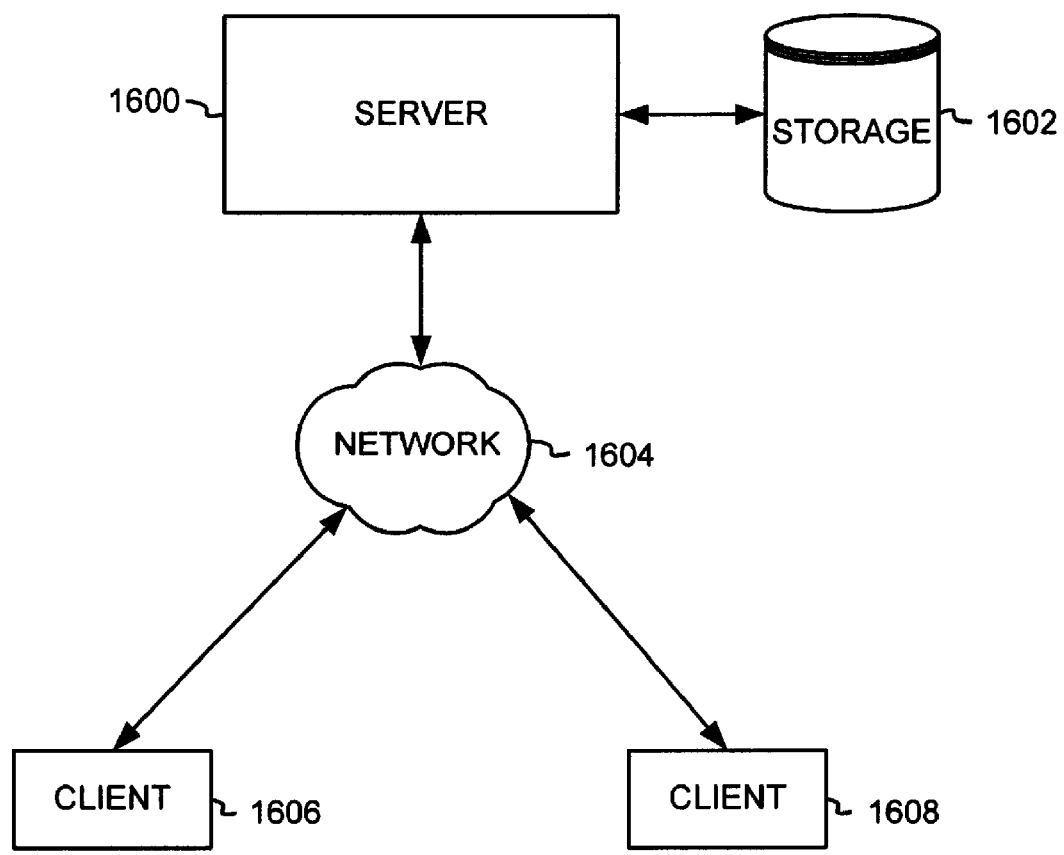
FIG. 16 is a block diagram illustrating an exemplary network for performing any of the aspects of the technology disclosed herein.

Any of the aspects of the technology described above may be performed using a distributed computer network. FIG. 16 shows one such exemplary network. A server computer 1600 can have an associated storage device 1602 (internal or external to the server computer). For example, the server computer 1600 can be configured to generate or update responses to scan patterns according to any of the embodiments described above (for example, as part of an EDA software tool, such as an ATPG tool). The server computer 1600 may be coupled to a network, shown generally at 1604, which can comprise, for example, a wide-area network, a local-area network, a client-server network, the Internet, or other such network. One or more client computers, such as those shown at 1606, 1608, may be coupled to the network 1604 using a network protocol. The work may also be performed on a single, dedicated workstation, which has its own memory and one or more central processing units.

Figure 17:
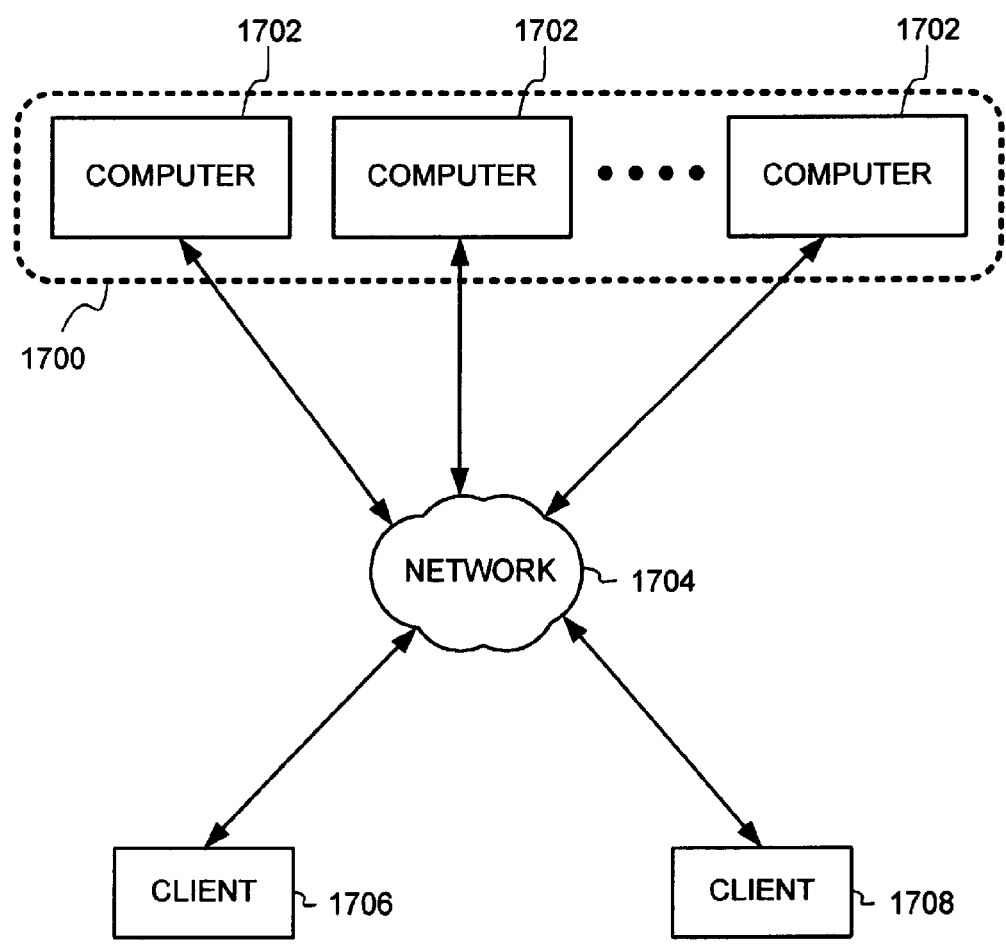
FIG. 17 is a block diagram illustrating another exemplary network for performing any of the aspects of the technology disclosed herein.

FIG. 17 shows another exemplary network. One or more computers 1702 communicate via a network 1704 and form a computing environment 1700 (for example, a distributed computing environment). Each of the computers 1702 in the computing environment 1700 can be used to perform at least a portion of a response generation process according to, for example, any of the embodiments described above (for example, as part of an EDA software tool, such as an ATPG tool or a EDT tool or a Simulator for instance). For instance, each of the computers may perform scan pattern generation and the response generation for different portions of the circuit design, for different types of patterns, or according to various other criteria. The network 1704 in the illustrated embodiment is also coupled to one or more client computers (e.g., 1706 and 1708).

Figure 18:
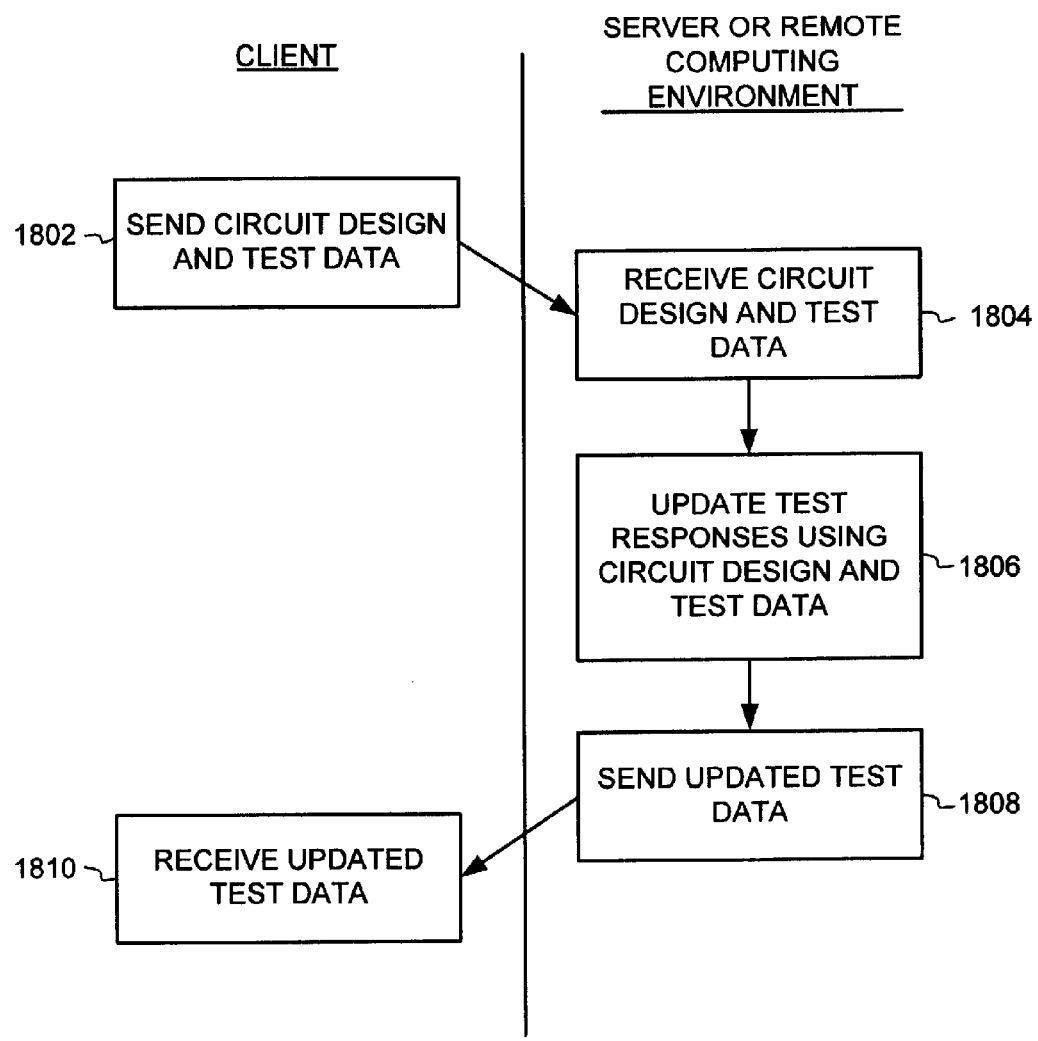
FIG. 18 is a block diagram illustrating a method of performing any of the aspects of the technology disclosed herein in a distributed computing environment.

FIG. 18 shows that a database or data structure containing design information (for example, design description in an HDL file, such as a Verilog, or VHDL file, and/or design constraints in a SDC file, a SDF file and/or a file comprising user defined design constraints) and a database or data structure containing test data (for example, scan patterns and responses) can be analyzed using a remote server computer (such as the server computer 1600 shown in FIG. 16) or a remote computing environment (such as the computing environment 1700 shown in FIG. 17) in order to update or modify the responses using any of the embodiments disclosed herein. At process block 1802, for example, the client computer sends design and test data to the remote server or computing environment. For instance, the client computer may send a Verilog or VHDL file, or other EDA design file, and a file comprising test data (in this example, test patterns and test responses). In process block 1804, the design and test data are received and loaded by the remote server or by respective components of the remote computing environment. In process block 1806, the test responses are updated using any of the disclosed embodiments. At process block 1808, the remote server or computing environment sends the updated test data (including the updated test responses) to the client computer, which receives the updated test data at process block 1810. It should be apparent to those skilled in the art that the example shown in FIG. 18 is not the only way to generate test responses using multiple computers. For instance, the design and test data may be stored on a computer-readable medium that is not on a network and that is sent separately to the server or computing environment (for example, a CD-ROM, DVD, or portable hard drive). Or, the server computer or remote computing environment may perform only a portion of the test response generation procedures.

Figure 19:
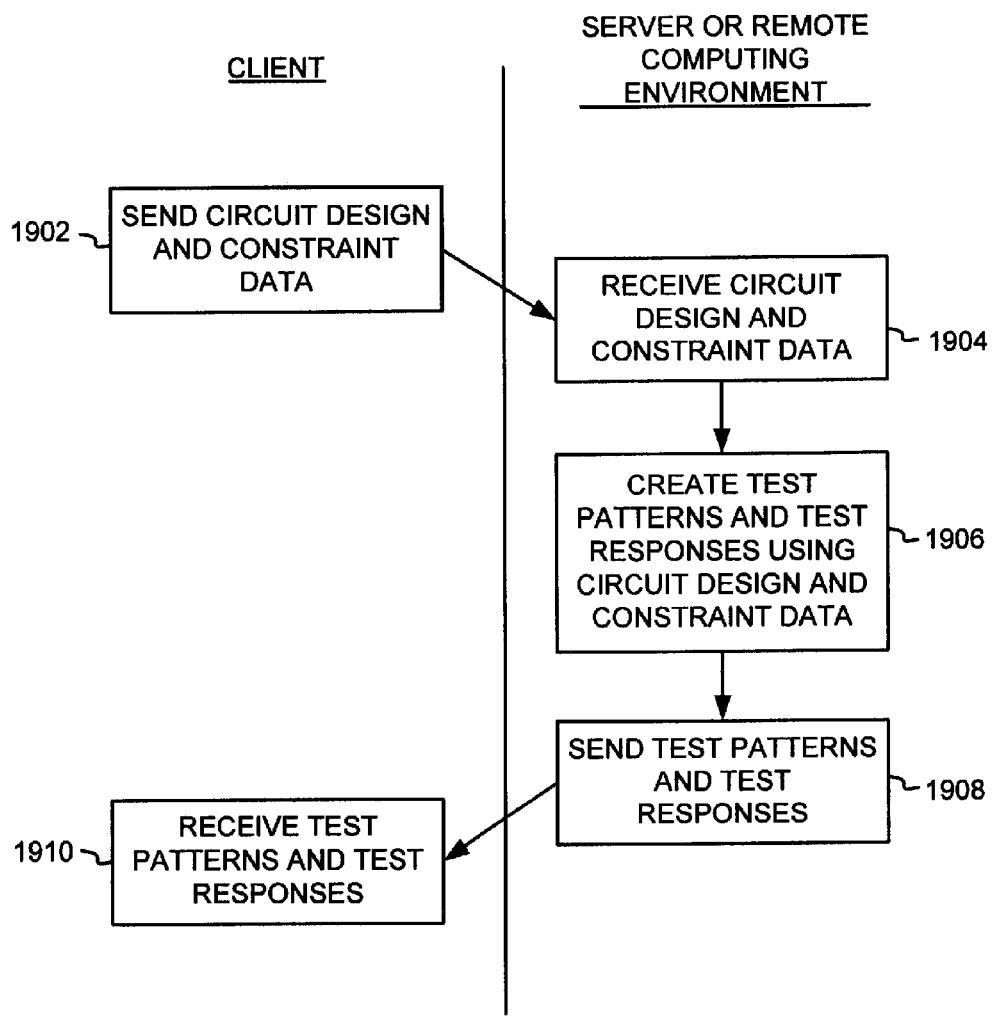
FIG. 19 is a block diagram illustrating another method of performing any of the aspects of the technology disclosed herein in a distributed computing environment.

FIG. 19 shows that a database or data structure containing design information (for example, an HDL file, such as a Verilog or VHDL file) and a database or data structure containing design constraint information (for example, a design constraints file, such as a SDC file) can be analyzed using a remote server computer (such as the server computer 1600 shown in FIG. 16) or remote computing environment (such as the computing environment 1700 shown in FIG. 17) in order to generate test data for the design, including test patterns and test responses, using embodiments of the disclosed technology. At process block 1902, for example, the client computer sends design and design constraint data to the remote server or computing environment. In process block 1904, the design and design constraint data are received and loaded by the remote server or by respective components of the computing environment. In process block 1906, scan patterns and responses using any of the disclosed embodiments. At process block 1908, the remote server or computing environment sends the scan pattern data (including the responses) to the client computer, which receives the data at process block 1910. It should be apparent to those skilled in the art that the example shown in FIG. 19 is not the only way to generate responses using multiple computers. For instance, the design and design constraint information may be stored on a computer-readable medium that is not on a network and that is sent separately to the server or computing environment (for example, a CD-ROM, DVD, or portable hard drive). Or, the server or remote computing environment may perform only a portion of the test response generation procedures.

Having illustrated and described the principles of the disclosed technology, it will be apparent to those skilled in the art that the disclosed embodiments can be modified in arrangement and detail without departing from such principles. In view of the many possible embodiments, it will be recognized that the illustrated embodiments include only examples and should not be taken as a limitation on the scope of the disclosed technology. Rather, the disclosed technology includes all novel and non-obvious features and aspects of the various disclosed apparatus, methods, systems, and equivalents thereof, alone and in various combinations and subcombinations with one another.

The disclosed technology includes, for example, a method to generate or modify test responses in the presence of timing exception paths during test generation (for example, at-speed test generation) comprising identifying the unknown states in the presence of timing exception paths, and creating or updating the test response by considering the effect of the unknown states at observation points. The timing exception paths can be, for example, false paths and/or multi-cycle paths. Further, the test patterns can comprise sequential patterns that are applied using multiple clock pulses (for example, at-speed clock pulses) from either the same clock or from different clocks. Further, the test pattern generation can be for any type of fault that results from defects in the integrated circuit design and manufacturing process.

In some embodiments, the act of identifying the unknown states in the presence of timing exception paths comprises at least one of the following: checking sensitization of timing exception paths, assigning unknown values to end points of sensitized timing exception paths, and propagating the unknown values to transitive closures. The checking of the sensitization condition of the timing exception paths can be performed, for example, using multi-valued logic simulation and/or a Boolean satisfiability solver. Further, the checking of the sensitization condition can include evaluating all possible transitions, including potential "glitches". In certain embodiments of the disclosed technology, when a transition occurs in one time frame, the effect of the transitions on the sensitization of the false path in later time frames should be verified. In such embodiments, when a past transition is noted, path sensitization verification should be performed the false path in the current time frame. If unknown values propagate to the end points of the path then the affected end points are assigned the unknown logic value at the current time frame and the effect of these unknown states is propagated forward by performing a conventional logic simulation, for instance. In some embodiments of the disclosed technology, where a multi-cycle with propagation delay d, any past transitions at the inputs in time frames less than t and greater than (t−d) should cause a path sensitization verification in the current time frame. If the unknown values propagate to the end points then the end points of the multi-cycle path can be assigned to unknown values and the effect of resulting unknown values propagated forward to account for the unknown values.

In some embodiments, the act of identifying the unknown states in the presence of timing exception paths includes analyzing interacting timing exception paths (for example, one or more path partitions). Such embodiments can comprise at least one of the following: computing mutually disjoint partitions of multiple interacting timing exception paths, checking simultaneous sensitization conditions of multiple timing paths in a given partition, assigning unknown values to end points of the sensitized timing exception paths, propagating the unknown values to transitive closures. The act of generating mutually disjoint partitions of timing exception paths can be performed, for example, through checking pair wise interactions between Boolean expressions derived from analyzing sensitizations of timing exception paths. The act of checking the sensitization conditions of timing exception paths belonging to a partition can be performed, for instance, using multi-valued logic simulation and/or a Boolean satisfiability solver. In some embodiments of the disclosed technology, the act of checking the sensitization conditions of timing paths belonging to a partition includes analyzing possible transitions, including potential glitches. In certain embodiments of the disclosed technology, when a false path is sensitized in one time frame of the at-speed testing, the condition for sustaining the sensitization of the false path is checked in later time frames. In such embodiments, when the sensitization condition of a false path is sustained, the end points of the false path can be assigned to unknown values and the effect of resulting unknown values propagated to transitive closures. In some embodiments of the disclosed technology, where a multi-cycle path is sensitized in the current time frame, the condition for sustaining the sensitization of the multi-cycle path is checked for the time period defined by the path multiplier of the multi-cycle path. In such embodiments, when the sensitization condition of a multi-cycle path is sustained, the end points of the multi-cycle path can be assigned to unknown values and the effect of resulting unknown values propagated to transitive closures.

We claim:

1. A method of generating responses to scan patterns for stimulating an electronic circuit design comprising one or more timing exception paths, the method comprising:
   using a computer,
   identifying the one or more timing exception paths in the circuit design;
   simulating application of a scan pattern to the circuit design, wherein the application of the scan pattern occurs over a plurality of time frames;
   for each of the plurality of time frames, determining whether the application of the scan pattern results in unknown values affecting one or more end points of the one or more timing exception paths; and
   generating a response to the scan pattern based on the unknown values observed at the one or more affected end points of the one or more timing exception paths.

2. The method of claim 1 further comprising determining a timing exception path cone including one or more gates associated with the one or more timing exception paths in the circuit design.

3. The method of claim 1 wherein identifying the one or more timing exception paths in the circuit design comprises:
   reading design constraint information associated with the circuit design; and
   extracting information from the design constraint information identifying the one or more timing exception paths in the circuit design.

4. The method of claim 3 further comprising modifying the extracted information identifying the one or more timing exception paths in the circuit design by performing at least one of the following:
   for at least some of the one or more timing exception paths that are defined via primary inputs, removing the clock information associated therewith;
   removing at least one of the one or more timing exception paths not associated with any gates; and
   removing at least one of the one or more timing exception paths defined in a fast clock network.

5. The method of claim 1 wherein determining whether applying the scan pattern to the circuit design results in the unknown values affecting the one or more end points comprises:
   identifying starting points of the one or more timing exception paths having transitions or glitches in at least one of the plurality of time frames;
   injecting unknown values at the starting points having the transitions or the glitches associated therewith;
   propagating the injected unknown values through logic associated with the one or more timing exception paths; and
   recording one or more of the affected end points having the injected unknown values propagated thereto.

6. The method of claim 1 wherein at least one of the one or more timing exception paths of the circuit is a conditional false path or a conditional multi-cycle path and wherein determining whether applying the scan pattern to the circuit design results in unknown values affecting the one or more end points comprises determining whether a condition associated with the conditional false path or the conditional multi-cycle path has failed.

7. The method of claim 1 wherein at least one of the one or more timing exception paths is identified to have hold-time violations associated therewith and wherein determining whether applying the scan pattern to the circuit design results in unknown values affecting the one or more end points comprises:
   determining whether a logic value at a data input of the starting point of the one or more timing exception paths is different from the logic value at its data output before a clock associated with the starting point is pulsed; and
   determining whether the clock associated with the starting point will be active in a current time frame.

8. The method of claim 1 wherein, at least one of the one or more timing exception paths is identified to have set-up time violations associated therewith, and wherein determining whether applying the scan pattern to the circuit design results in unknown values affecting the one or more end points comprises identifying starting points having associated therewith a transition or a glitch in a current time frame.

9. The method of claim 1, further comprising repeating the acts of identifying, applying, determining and generating to generate responses to a plurality of scan patterns.

10. A method of generating responses to stimulation of an electronic circuit design by scan patterns in the presence of one or more timing exception paths, the method comprising:
using a computer,
identifying the one or more timing exception paths in the circuit based on design constraints associated with the circuit design;
applying a plurality of the scan patterns to the circuit design, each scan pattern being applied over a plurality of time frames; and
for each of the plurality of the scan patterns and their associated time frames, determining whether the one or more timing exception paths should be subjected to a path sensitization verification process;
generating the respective responses based at least in part on the results of the path sensitization verification process; and
storing the respective responses in a computer-readable medium.

11. The method of claim 10, wherein determining whether the one or more timing exception paths should be subjected to the path sensitization verification process comprises identifying transitions and glitches being applied to the circuit design that could affect the response by causing the unknown values to propagate to end points of the one or more timing exception paths.

12. The method of claim 10 further comprising:
for a respective one of the plurality of scan patterns, identifying starting points of the one or more timing exception paths that are determined to be subjected to the path sensitization verification process; and
applying the path sensitization verification process by injecting unknown values at the identified starting points, propagating the unknown values through logic associated with the circuit design, and recording one or more affected end points of the one or more timing exception paths having unknown values propagated thereto.

13. The method of claim 10, wherein determining whether the one or more timing exception paths should be subjected to the path sensitization verification process comprises determining which ones of the one or more timing exception paths had been previously subjected to the path sensitization verification process.

14. The method of claim 10, wherein at least one of the one or more timing exception paths is a conditional false path or a conditional multi-cycle path and wherein, determining whether the conditional false path or the conditional multi-cycle path should be subjected to the path sensitization verification process comprises determining whether a condition associated with the conditional false path or the conditional multi-cycle path has failed.

15. The method of claim 10, wherein at least one of the one or more timing exception paths is identified as having associated therewith a hold-time violation and wherein, determining whether the path violating the hold-time should be subjected to the path sensitization verification process comprises:
determining whether a logic value at a data input of the starting point of the path violating the hold-time is different from the logic value at its data output before a clock associated with the starting point is pulsed; and
determining whether the clock associated with the starting point will be active in a current time frame.

16. The method of claim 10, wherein at least one of the one or more timing exception paths is identified as having associated therewith a set-up time violation, and wherein determining whether the path violating the set-up time should be subjected to the path sensitization verification process comprises determining whether a starting point of the path violating the set-up time has a transition or a glitch in a current time frame.

17. The method of claim 10, further comprising determining a timing exception path cone comprising one or more gates associated with the one or more timing exception paths in the circuit.

18. The method of claim 10 wherein, at least one of the one or more timing exception paths is a conditional false path, wherein the design constraints comprise one or more Boolean constraints, and wherein identifying the one or more timing exception paths in the circuit based on the design constraints associated with the circuit comprises:
applying the one or more Boolean constraints to the circuit design; and
identifying the conditional false path based on paths of the circuit design that could be sensitized if the one or more Boolean constraints are violated.

19. A method of generating a response pattern in reply to a scan pattern applied to a circuit design driven simultaneously by a plurality of clocks from different clock domains, the method comprising:
using an automatic test pattern generation software tool implemented in a computer,
selecting at least a pair of the plurality of clocks;
determining sequential elements associated with the selected pair of the plurality of the clocks;
designating a path comprising the determined sequential elements as a false path with a hold time violation; and
determining whether the designated false path is sensitized upon application of the scan pattern.

20. The method of claim 19, further comprising:
if the designated false path is sensitized, applying unknown values to the end points of the sensitized false path;
propagating the unknown values further in the circuit design; and
including unknown values that appear at observable points of the circuit design during a capture time frame to generate the response patterns.

21. The method of claim 20 wherein the pair of the plurality clocks is selected based at least in part on an analysis of interaction between the pair of clocks and a clock skew associated therewith.

* * * * *